United States Patent
Deak et al.

(10) Patent No.: US 7,005,856 B2
(45) Date of Patent: Feb. 28, 2006

(54) PROTECTIVE RELAY TEST DEVICE

(75) Inventors: Bela Deak, Arlington, TX (US); Michael Edwards, McKinney, TX (US); Terry L. Elzy, Frisco, TX (US); Michael Gordon, Desoto, TX (US); Mahmoud Harmouch, Dallas, TX (US); Aaron C. Klijn, Duncanville, TX (US); Marvin G. Miller, Carrollton, TX (US); Francisco J. Pataro, Dallas, TX (US); Eugenio J. Tacconi, Arlington, TX (US)

(73) Assignee: Avo Multi-Amp Corporation, Dallas, TX (US)

( * ) Notice: Subject to any disclaimer, the term of this patent is extended or adjusted under 35 U.S.C. 154(b) by 0 days.

(21) Appl. No.: 10/874,458

(22) Filed: Jun. 23, 2004

(65) Prior Publication Data

US 2005/0030693 A1    Feb. 10, 2005

(51) Int. Cl.
*H02H 5/04* (2006.01)
(52) U.S. Cl. .................... 324/418; 702/118
(58) Field of Classification Search ........ 324/418–424; 361/78–80, 99
See application file for complete search history.

(56) References Cited

U.S. PATENT DOCUMENTS 4,464,628 A * 8/1984 Nozawa .................... 324/418

5,710,513 A    1/1998 March ......................... 324/424
6,396,279 B1 * 5/2002 Gruenert ..................... 324/424
6,850,073 B1    2/2005 Elms et al. .................. 324/509

OTHER PUBLICATIONS

Aaron C. Klijn, et al., *Protective Relay Test Device Having a Hand-Held Controller*, Filing Date—Jun. 23, 2004, U.S. Appl. No. 10/875,017, Specification (74 pgs.) and Drawings (18 sheets).

Michael Edwards, et al., *Test Device for Signaling and Waveform Generation and Monitoring*, Filing Date—Jun. 23, 2004, U.S. Appl. No. 10/875,007, Specification (76 pgs.) and Drawings (18 sheets).

Aaron C. Klijn, et al., *Programmable System for Device Testing and Control*, Filing Date—Jun. 23, 2004, U.S. Appl. No. 10/874,969, Specification (79 pgs.) and Drawings (18 sheets).

* cited by examiner

*Primary Examiner*—Vincent Q. Nguyen
(74) *Attorney, Agent, or Firm*—Conley Rose, P.C.; J. Robert Brown, Jr.

(57) ABSTRACT

A test device for testing relays is provided. The test device includes a chassis and a plurality of generator components removably coupled to the chassis. Each of the plurality of generator components have a signal generator, a CPU to promote test signal generation by the signal generator, and an amplifier to amplify signals generated by the signal generator. The test device also includes a controller coupled to communicate with the plurality of generator components.

10 Claims, 10 Drawing Sheets

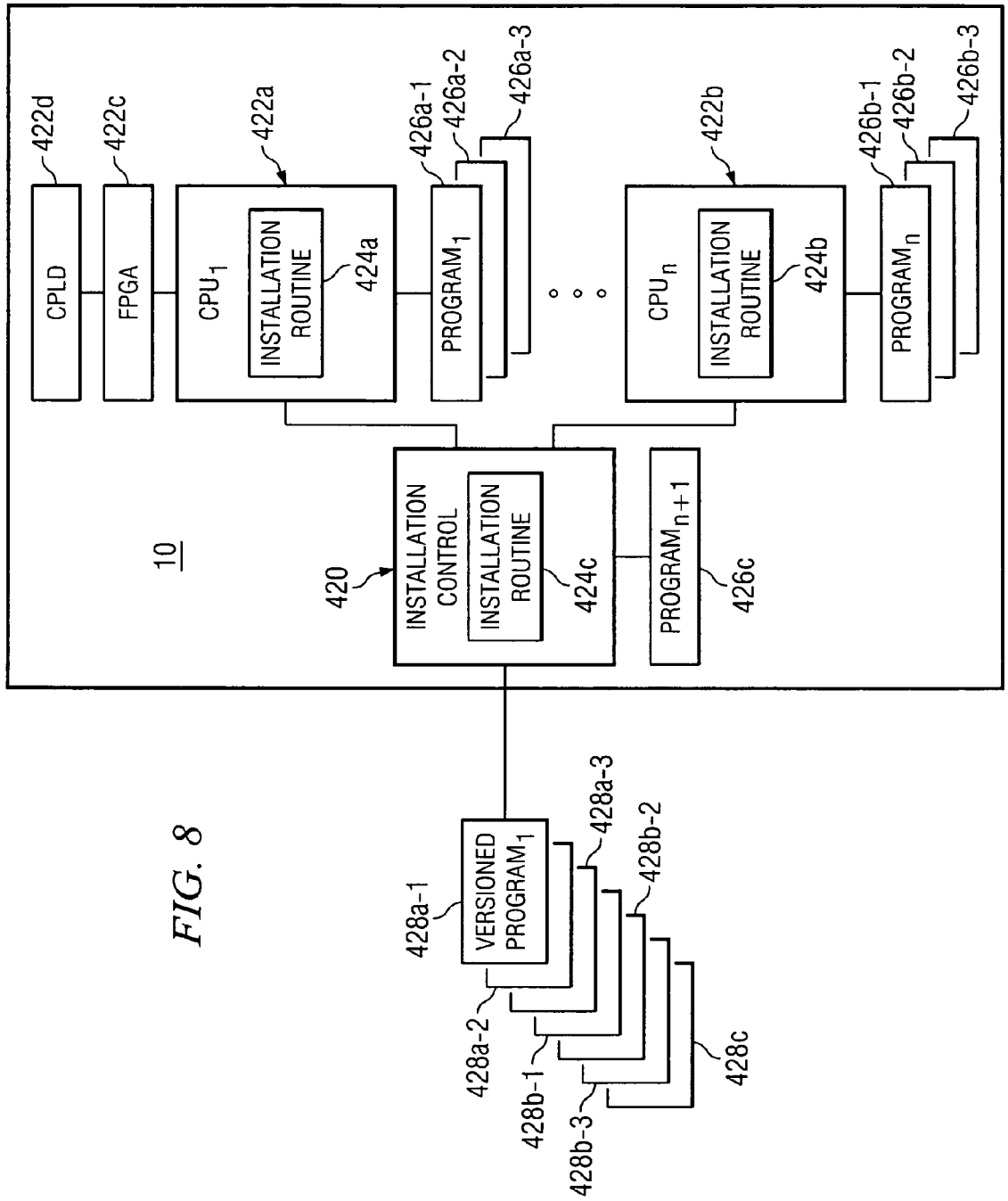

PROTECTIVE RELAY TEST DEVICE

CROSS-REFERENCE TO RELATED APPLICATIONS

This application is related to U.S. patent application Ser. No. 10/874,969 entitled "Programmable System for Device Testing and Control", and U.S. patent application Ser. No. 10/875,007 entitled "Test Device for Signaling and Waveform Generation and Monitoring", and U.S. patent application Ser. No. 10/875,017 entitled "Protective Relay Test Device Having a Hand-held Controller", all filed one even date herewith and all of which are incorporated herein by reference for all purposes.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present disclosure is directed to test equipment, and more particularly, but not by way of limitation, to a system and method for testing protective electrical power relays.

BACKGROUND OF THE INVENTION

The electrical power system in the United States generates three-phase alternating current (AC) electrical power. Each power phase is 120 degrees out of phase, plus or minus, with the other two power phases. The voltage of any phase oscillates sinusoidally between positive voltage and negative voltage. It happens that three-phase power distribution provides an acceptable compromise between electrical generation and distribution efficiency and the expense and complexity of power distribution equipment.

It is more efficient to transmit electrical power at high voltage levels than at low voltage levels. Electrical power is generated as three-phase AC power at moderate voltage levels in the 12 thousand volt (kV) to 25 kV range. The voltage level is stepped up to the 110 kV to 1000 kV range using a transformer for transmission over long transmission lines, hence minimizing transmission line power loss. The transmission line voltage is stepped down, using a transformer at a substation, to the 12 kV to 35 kV range for local distribution. The local distribution voltage level is further stepped down through one or more transformer stages to provide 120 volt AC power to the home and office. Special accommodations may be made for manufacturing plant electrical power consumers.

Switchgear is employed to control the transmission systems. The switchgear may include circuit breakers, fuses, switches, and relays. Electrical power distribution protective relays, hereinafter referred to simply as "relays," monitor a variety of electric power distribution parameters and control circuit breakers based on the state or condition of the electric power distribution parameters. For example, if too much current is being provided to a local distribution line, a relay may command a circuit breaker or switch gear to open, thus interrupting the supply of electrical power to that local distribution line. Current, voltage level, frequency, phase, and other parameters may be monitored by relays.

Relays vary in complexity from electromechanical devices monitoring a single parameter to microprocessor controlled relays capable of monitoring many independent parameters concurrently. The relays are capable of changing their behavior when reprogrammed for monitoring various characteristics of a power distribution system. For safe and reliable operation of the power distribution system it is necessary to thoroughly test relays in the manufacturer's plant, prior and upon installation in the power distribution system, and at periodic intervals after installation. Failures of the power distribution system, such as the power blackout in the northeastern United States and southeastern Canada in 2003, can result in significant economic losses and inconvenience, and perhaps danger to those requiring special medical services dependent on electrical power distribution.

Testing of relays may be accomplished by emulating theoretical fault characteristics of a power distribution or generation system, thereby validating design elements associated with protection systems on a power distribution or generation system. This emulation consists of various parameter characteristics associated with the power distribution system during a fault. Fault conditions, generated through emulation, are therefore applied to the relay, and expected results are anticipated, validated or settings corrected for correct operation when the relay is applied in an actual power distribution system.

SUMMARY OF THE INVENTION

The present disclosure provides, according to one embodiment, a test device for testing relays. The test device includes a chassis and a plurality of generator components removably coupled to the chassis. Each of the plurality of generator components have a signal generator, a CPU to promote test signal generation by the signal generator, and an amplifier to amplify signals generated by the signal generator. The test device also includes a controller coupled to communicate with the plurality of generator components.

In one embodiment, the present disclosure provides a method for testing a relay using a relay test device. The method includes generating test signals to test the relay by a plurality of modular signal generation components of the relay test device. The method includes identifying a failure by one of the plurality of modular signal generation components and removing the failed one of the plurality of modular signal generation components from within an enclosure of the relay test device. The method provides while the failed one of the modular signal generation components is removed from the enclosure of the relay test device to generating, by the remaining modular signal generation components, test signals to test the relay. The method includes obtaining a working modular signal generation component and installing the working modular signal generation component in the enclosure of the test device. The method also provides for generating, by at least the working modular signal generation component, test signals to test the relay.

In one embodiment, a system for testing a relay is provided. The system includes a signal generator to generate at least one test signal and an amplifier to receive the test signal from the signal generator and amplify the test signal. The amplifier also outputs the test signal to the relay to test the relay. The system also includes a controller module programmable with a relay test procedure. The controller module is in communication with the signal generator to promote the signal generator generating test signals based on the relay test procedure. The controller module is also operable to monitor a state of the relay and to determine a results of the relay test.

These and other features and advantages will be more clearly understood from the following detailed description taken in conjunction with the accompanying drawings and claims.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIG. 8 is a block diagram of a software and firmware installation system for the several embodiments of the relay test device.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein.

Relays may be tested employing a relay test device containing a powerful power supply and amplifier and employing a separate personal computer (PC) to control the relay test device. The relay test device may be relatively dumb and may depend upon the separate PC to provide the intelligence needed to test relays. Unfortunately PCs may not operate effectively in the harsh field conditions where relays are installed. High levels of electromagnetic interference in the field may damage PCs or interfere with the reliable functioning of PCs. Dirt and grit may readily infiltrate the mechanical workings of the PC in the field. Industrial use of standard PCs can result in damage to the PC from excessive handling, and exposure to environments not well suited for standard office PC equipment, thereby shortening the lifespan of the PC.

Electrical power distribution transducers, for example, current loop transducers, which provide an indication of the current flowing through a wire or transmission line, are typically tested using an independent test set operated under the control of the separate PC.

Also, a relay test operator typically must have relatively advanced knowledge of relays and electrical power distribution to test the relays employing the relay test device and the separate PC. Personnel with advanced knowledge may be in limited supply, increasing the electrical power company's labor cost due to competition to hire limited skilled personnel or delaying testing.

In one or more of the disclosed embodiments, the present disclosure describes an improved relay test device which combines, in one box, the intelligence necessary to operate independent of the separate PC and to support automated tests, integrates in the same box a transducer testing capability, and includes a number of other new features and capabilities.

Programmable Relay Test Device

Figure 1:
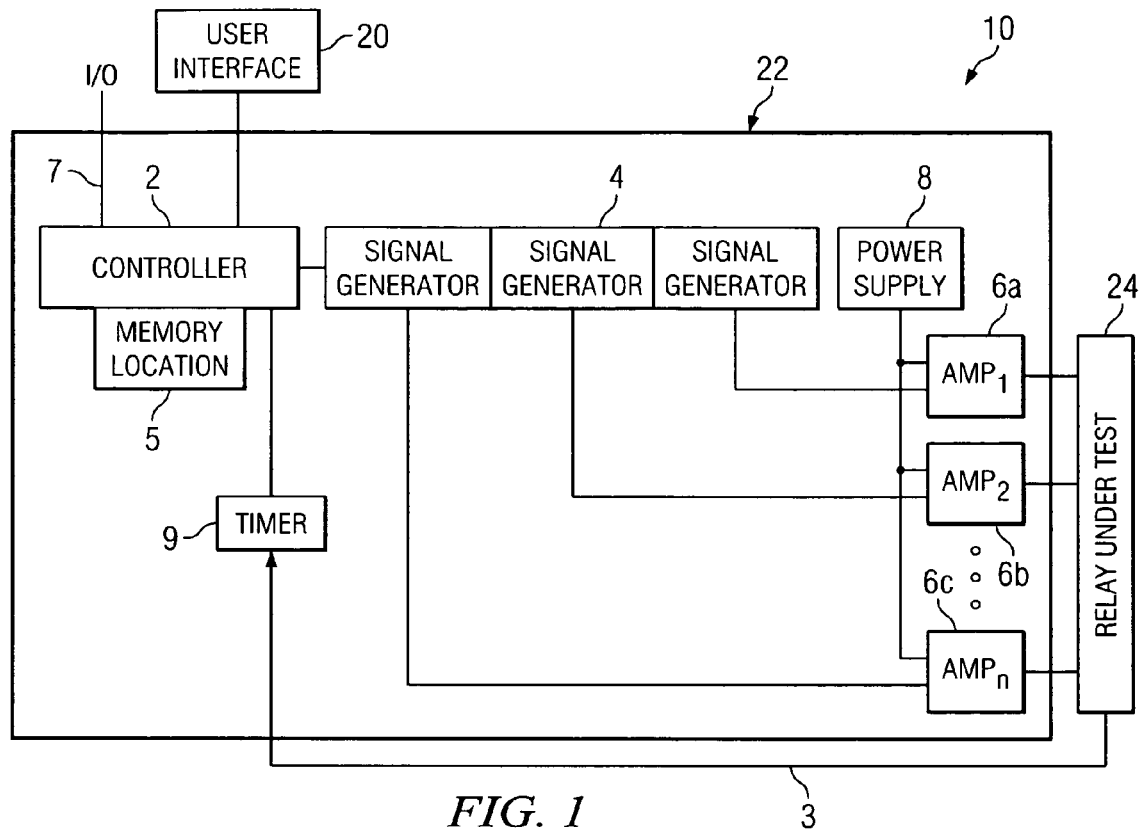
FIG. 1 is a block diagram of a relay test device according to one embodiment.

Turning now to FIG. 1, a block diagram of an embodiment of a relay test device 10 is depicted. The relay test device 10, includes a controller 2, a signal generator module 4 which may include one or more signal generators, a plurality of signal amplifiers 6—a first signal amplifier 6a, a second signal amplifier 6b, and a third signal amplifier 6c—and a power supply 8. A user interface (UI) 20 is coupled to the controller 2 and provides command inputs and displays test results. In the present embodiment, the controller 2, the signal generator module 4, the signal amplifiers 6, and the power supply 8 may be retained by an enclosure 22. The enclosure 22 may provide shielding from electromagnetic interference (EMI), help control cooling of the system electronics comprised of the controller 2, the signal generator module 4, the signal amplifiers 6, the power supply 8 and provide environmental protection. In some embodiments the enclosure 22 may not completely enclose the controller 2, the signal generator module 4, the signal amplifiers 6, and the power supply 8. The enclosure 22 may be open on one or more sides. The enclosure 22 may be formed of various materials, including metal or polymeric materials. The enclosure 22 may be formed of expanded metal material. The enclosure 22 may also be referred to as a chassis, an equipment cabinet, a shell, or a body.

A relay under test 24 is depicted as connected to the output of the first signal amplifier 6a. In some test scenarios, the relay under test 24 may be connected to the relay test device 10 in other manners, and the connection between the relay under test 24 and the relay test device 10 may include a plurality of wires or cables. Some relays now provide an Ethernet interface, and the relay test device 10 may communicate with the relay under test 24 via an Ethernet connection.

The controller 2, in this embodiment, may include a central processor unit (CPU), which may be composed of one or more digital signal processors (DSPs), microprocessors (uPs), microcontrollers (uCs), field programmable gate arrays (FPGAs), complex programmable logic devices (CPLDs), programmable logic devices (PLDs), and/or application specific integrated circuits (ASICs). The CPU of the controller 2 may employ an operating system, such as a Real Time Operating System (hereinafter referred to as "RTOS") or a standard non-deterministic operating system.

The controller 2 may contain a plurality of memory devices including one or more random access memory (RAM), read only memory (ROM), erasable programmable read only memory (EPROM), electrically erasable programmable read only memory (EEPROM), and Flash memory or a combination thereof. The controller 2 may have multiple interfaces, collectively referred to as input/output (I/O) 7, including but not limited to any communications method, such as an Ethernet interface, a wireless interface, an IEEE-1394 interface, an IEEE-488 interface, a RS-232 interface, a RS-422 interface, a printer interface, a universal serial bus interface (USB), a proprietary intercommunications interface, a plurality of programmable digital inputs, a plurality of programmable digital outputs, one or more transducer inputs, and other interfaces. These interfaces permit the relay test device 10 to communicate with other devices, for example via an internet, via an intranet, via wireless communications, and via satellite or other means to other data-oriented systems, such as a PC or another controller 2 on a separate system for particular methods of test or data acquisition.

The controller 2 may store, in one or more of the memory devices, such as memory location 5, a test procedure or test program that the controller 2 executes to sequence the relay test device 10 through the steps of testing the relay under test 24. The controller 2 also may store, in one or more of the memory devices, a test procedure or test program that the controller 2 executes to test a transducer, for example to test a current loop transducer using the transducer input. The controller 2 may communicate with the relay under test 24, for example via Ethernet, to request from the relay under test 24 information about the settings or control configuration of the relay under test 24 and to command or reprogram the relay under test 24 to a group of settings or control configuration sent to the relay under test 24 by the controller 2. The controller 2 is in communication with the signal generator module 4 and controls the signal generator module 4 to produce desirable test signals. The controller 2 monitors the relay under test 24 throughout the test, determines a result of the test of the relay under test 24, and sends the result to the UI 20 to be displayed.

The controller 2 may log all the results, test procedure actions and state changes of the relay, including initial settings, commonly termed "as found settings," of the relay under test 24 and any reprogramming settings sent to the relay under test 24, to memory where it may be accessed at a later time. The access of this data may be accomplished using one of the interfaces of the controller 2, for example over Ethernet or over wireless or other typical communications means to the Internet, or the relay test device 10 may be transported to a laboratory, office, or shop to download one or more test logs for further. analysis. The test logs make it possible to accurately reproduce a test run, even if the test system default values are changed. The relay test device 10 may be in communication with other equipment employed in testing the relay under test 24, and the relay test device 10 may store, such as in the system memory, information provided by the other equipment.

The signal generator module 4 provides a test signal to each of the signal amplifiers 6. Each signal amplifier 6 boosts the test signal to a level which is useful for outputting to test the relay under test 24. In one embodiment, the signal amplifier 6 may produce a 150 to 200 volt-amp (VA) power level. In other embodiments, the signal amplifier 6 may be rated to produce maximum power outputs in the range from only a few VA to several thousand VA, depending on the type and application of the protection relay being tested. Typically, signal generators used for communications and bench top electronic circuit design work provide low level signals, such as 1 to 12 volts into an impedance of 50 to 75 ohms. Signal generators used in protection relay testing typically utilize power levels greater than this, and, in some embodiments, may be focused on 50 and 60 Hz line rates, utilizing voltages of 5 volts to 300 volts into impedances that vary from less than one-tenth ohm to as much or more than 600 ohms. In addition, signal generators used in bench top electronic circuit design are usually not designed to drive a wide variety of loads, such as presented by various protective relay instruments, nor provide the wide range of voltages and currents required. Protective relay testing may use signal generators that are oriented towards abrupt changes and arbitrary waveform generation mimicking abrupt faults applied to a protection relay, although subtle changes and constant signals are used in various forms of protective relay testing, such as with testing phase-related protection relays and generation system protection relays. The power supply 8 provides direct current (DC) power to each of the signal amplifiers 6. The power supply 8 receives alternating current (AC) power from the AC power mains (not shown) within the relay test device 10. The AC power mains receive power from, for example, a power chord and plug connected to external utility power. The controller 2 and the signal generator module 4 may receive DC power from the power supply 8 or may receive power from one or more other DC power supplies (not shown).

The signal generator module 4 includes a central processor unit (CPU) which may be composed of one or more DSPs, uPs, uCs, FPGAs, CPLDs, PLDs, and/or ASICs. The signal generator module 4 may include one or more memories including RAM, ROM, EPROM, EEPROM, and Flash memory or a combination thereof. The signal generator module 4 may generate complex signals from waveform components using a computer program, software, or firmware stored in one or more memories. The signal generator module 4 may playback periodic waveforms stored in data tables, may playback a digital fault recording (DFR) recorded by or of a relay, or may playback a streaming digital data recording or real-time stream from another source such as an external signal data reproduction system such as a PC or data recorder via means similar to MP3 streams utilized on the Internet for audio streaming broadcasts today. These processes are discussed in more detail hereinafter when discussing another embodiment of the relay test device 10.

The relay test device 10 provides a stand-alone test set which may be used by personnel with relatively limited knowledge and experience of relays and electrical power distribution. The relay test device 10 may simplify the complex field test procedures associated with other test devices down to procedures involving pointing and clicking by field service personnel which causes complete tests to run and test results to be reported and stored. In one embodiment, the relay test device 10 may support initiating tests from and displaying and analyzing results on a general purpose computer system, such as a personal computer or a workstation, for example in a manufacturer's relay test shop, or via a display directly associated and a part of the relay test device 10. In some embodiments, a relay status monitor feedback 3 is operable to communicate with a timer 9.

Figure 2:
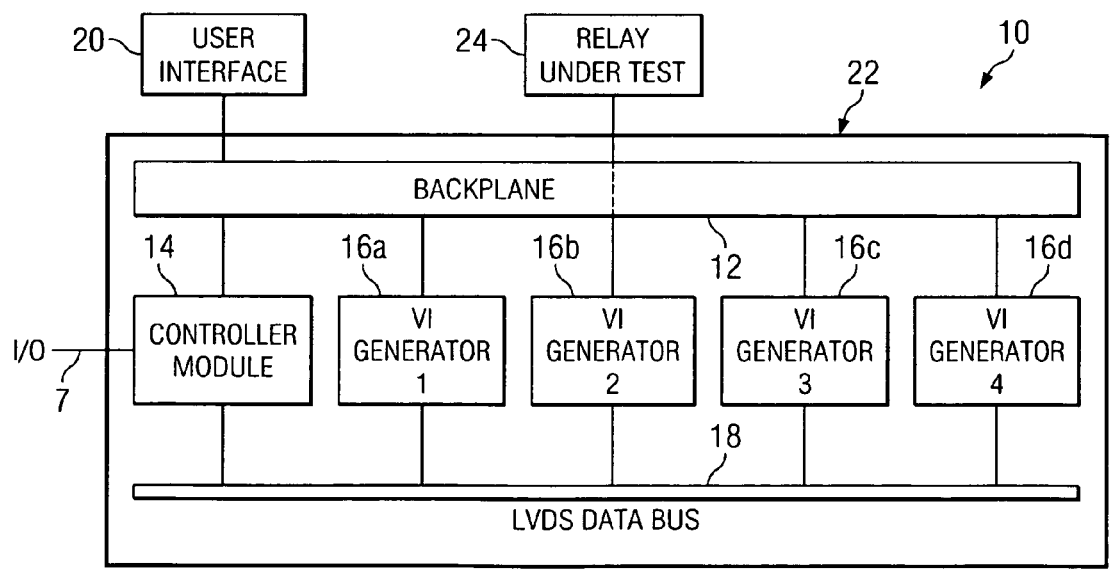
FIG. 2 is a block diagram of another embodiment of the relay test device.

Turning now to FIG. 2, a block diagram of another embodiment of the relay test device 10 is depicted. While the embodiment of the relay test device 10 depicted in FIG. 1 provides many of the same advantages and capabilities of the embodiment of the relay test device 10 depicted in FIG. 2, the embodiment depicted in FIG. 1 contains a single point of failure in the signal generator module 4 and a single point of failure in the power supply 8. For example, if the signal generator module 4 fails, the embodiment of the relay test device 10 depicted in FIG. 1 may be unavailable for continued testing. Similarly, if the power supply 8 fails, the embodiment of the relay test device 10 depicted in FIG. 1 cannot continue testing. The embodiment of the relay test device 10 depicted in FIG. 2 removes many of the critical single points of failure associated with the architecture of the relay test device 10 depicted in FIG. 1, by utilizing redundant elements in the areas of the design most prone to stress induced failures.

The relay test device 10 includes a backplane 12, a controller module 14, and a plurality of VI (voltage and current) generators 16—a first VI generator 16a, a second VI generator 16b, a third VI generator 16c, and a VI generator 16d. In an embodiment, the VI generators 16, which may also be referred to as signal generators, communicate with the controller module 14 over a low voltage differential signaling (LVDS) data bus 18 and employ an error checking and correction protocol to assure reliable communications. The error checking and correction protocol may employ parity bits, packet delimiters or markers, packet receipt confirmation handshakes, cyclic redundancy checking (CRC), and/or other well known methods of verifying communications. In another embodiment, however, the LVDS bus may not be employed, and alternative communication buses may be employed. In another embodiment the error checking and correction protocol is not employed. In some embodiments, either more or fewer VI generators 16 may be installed in the relay test device 10.

The controller module 14 may communicate with a user interface (UI) 20 via a connector on the backplane 12. In an alternate embodiment, the controller module 14 may communicate with the UI 20 without routing through the backplane 12. In an embodiment, the UI 20 communicates with the controller module 14 using LVDS. In the embodiment depicted in FIG. 2, the LVDS data bus 18 is shown separately from the backplane, whereas in another embodiment, the LVDS data bus 18 may be integrated within the backplane. The controller module 14 employs an error checking and correction protocol to assure reliable communication with the UI 20. The error checking and correction protocol may employ parity bits, packet delimiters or markers, packet receipt confirmation handshakes, CRC, and/or other well known methods of verifying communications. In another embodiment, however, LVDS may not be employed. In another embodiment the error checking and correction protocol is not employed. The controller module 14 receives DC power from a DC power supply (not shown).

The relay under test 24 is depicted as connected to the output of the second signal generator 16b. In some test scenarios, the relay under test 24 may be connected to the relay test device 10 in other manners, and the connection between the relay under test 24 and the relay test device 10 may include a plurality of wires or cables.

The controller module 14 may be referred to as a digital module. The controller module 14 may connect to at least a portion of the I/O 7 directly add may connect to other interfaces via the backplane 12. The VI generators 16 may be referred to as VIGENs, because they may generate voltage (V) and current (I) signals. In the present embodiment, the backplane 12, the controller module 14, the VI generators 16, and the LVDS data bus 18 are retained within the enclosure 22. In some embodiments the enclosure 22 may not completely enclose the backplane 12, the controller module 14, the VI generators 16, and the LVDS data bus 18.

The backplane 12 provides connectivity to receive a plurality of inputs and to transmit a plurality of autonomous outputs. The controller module 14 and the VI generators 16 connect to the inputs and outputs, each of which will be discussed hereafter in association with the controller module 14 and the VI generators 16.

Figure 3:
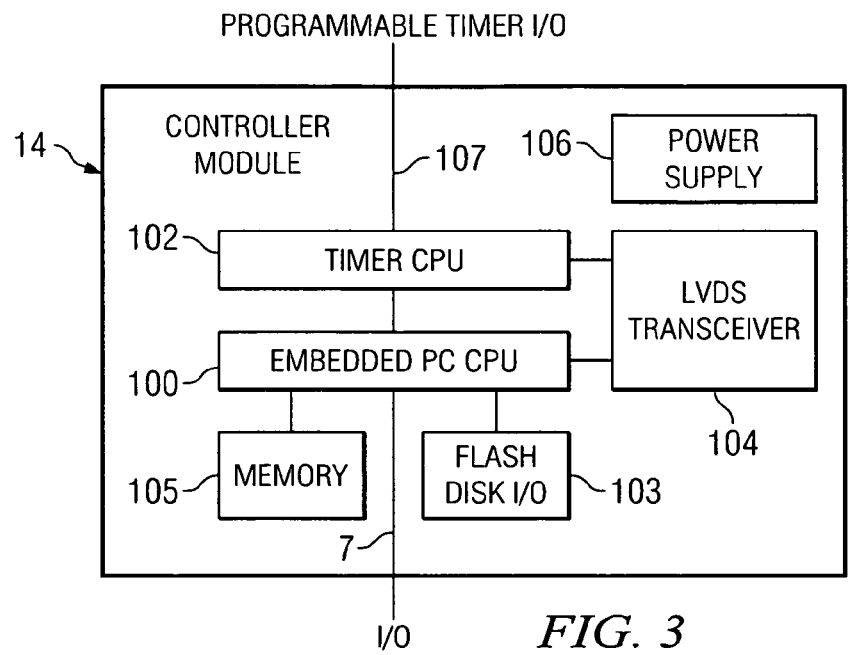
FIG. 3 is a block diagram of a controller module of the relay test device.

Turning now to FIG. 3, a block diagram of the controller module 14 is depicted. The controller module 14 includes an embedded PC CPU 100, a timer CPU 102, and a first LVDS transceiver 104. The embedded PC CPU 100 may comprise one or more DSPs, FPGAs, PLDs, CPLDs, ASICs, uPs, uCs, or a combination thereof. The embedded PC CPU 100 is in communication with memory 105, the LVDS transceiver 104, input/output devices, and network connectivity devices. The input/output devices and network connectivity devices may be collectively referred to as I/O 7. Some of the I/O 7 depicted in FIG. 3 may route through the backplane 12 while some of the I/O 7 may directly connect to interfaces or external devices. In an embodiment, the embedded PC CPU 100 may be in communication with a secondary memory device, for example, a magnetic disk storage device, an optical disk storage device, another type of media storage device employing an alternate media, or a memory device represented as a disk storage device to the embedded PC CPU 100. Memory devices, such as a memory 105 and a flash disk I/O 103, may be located on the controller module 14 and accessible to the embedded PC CPU 100 and the timer CPU 102. The memory devices may include such as RAM, ROM, EPROM, EEPROM, and Flash memory or a combination thereof. In an embodiment, the controller module 14 is provided with significant memory, such as 64 megabytes of memory. The controller module 14 may store test parameters, multiple versions of software and firmware, and multiple versions of an operating system.

In an embodiment, the controller module 14 is a single board computer (SBC). The term SBC is an industry standard term for a self-contained computer system. An SBC may contain a CPU (such as an X86, ARM, Risc or other type of main processing unit) memory for random access operation typically utilized by the operating system and the applications, storage of data such as disk on a chip (DOC) compact flash, or microdrive, as well as standard interfaces such as IDE to connect to the compact flash, microdrive or standard externally mounted drive you see in a standard desk top PC. It usually also contains standard interfaces, such as RS-232, Digital I/O, PC104 and PC104 Plus interfaces, and often contains USB, Ethernet, keyboard, mouse and video display interface capabilities.

The input/output devices may include one or more RS-232 serial data ports, RS-422 serial data ports, IEEE-488 ports, printer interfaces, USB interfaces, Ethernet ports, and EPOCH high current interface ports. Some of these input/ output devices may be connected as I/O 7 directly to the PC CPU 100. The input/output devices may also include one or more clock inputs, clock outputs, transducer inputs, touch view interfaces, a plurality of programmable digital inputs, and a plurality of programmable digital outputs. In an embodiment, the programmable I/O 107 may be connected to the timer CPU 102. These interfaces permit the relay test device 10 to communicate with other devices, for example via an Internet, via an intranet, via wireless communications, and via satellite. In an embodiment, the embedded PC CPU 100 employs the VxWorks® operating system.

The embedded PC CPU 100 executes software or firmware operable to install versions of software and of firmware, to manage the UI 20, to receive and store a definition of a test procedure, and to manage all the resources of the relay test device 10 during testing activities. The embedded PC CPU 100 executes programs that test the relay under test 24. The embedded PC CPU 100 also executes programs that test transducers, for example current transducers. The relay test device 10 may store a plurality of user profiles, for example in the memory on the controller module 14. The user profiles include individual user preferences and may include user specific cues, such as reminders of in-progress activities or things to do. User preferences may include display preferences, for example displaying vectors in the range from −180 degrees to +180 degrees versus displaying vectors in the range from 0 degrees to 360 degrees. The user profile may be stored with test data so that the test of the relay under test 24 may be completely re-created.

The UI 20 is a ruggedized input/output device based on a video display, touch screen and controller, and a CPLD for communications with the embedded PC CPU 100, a user control dial and enclosure. In the preferred embodiment, the embedded PC CPU 100 provides the intelligence and processing capabilities for the UI 20. As such, the embedded PC CPU 100 determines the content of the display to be presented by the UI 20 and sends the content of the display to the UI 20. The UI 20 receives a control input and sends user initiated control input to the embedded PC CPU 100. The embedded PC CPU 100 processes the control input from the UI 20, including navigating through a hierarchy of displays. In an alternate embodiment, however, the UI 20 may provide the intelligence and processing power to navigate through menus and to generate the content of the display. In an alternate embodiment the UI 20 may contain and execute test procedures and send test control commands to the VI generators 16 via the controller module 14 or via another communication path. A touch view interface (TVI), a particular embodiment of the UI 20, will be discussed in greater detail hereinafter.

The embedded PC CPU 100 may receive the definitions of test procedures through a network connection, for example an Ethernet connection to a local area network (LAN), and stores the definitions of test procedures in memory, such as in RAM or in nonvolatile memory such as flash memory. The relay test device 10 may receive definitions of test procedures in an office LAN environment, for example. Alternately, the relay test device 10 may receive definitions of test procedures in the field, for example via an Ethernet connection to a laptop PC having wireless connectivity to an Internet or to a mobile phone having wireless connectivity to an Internet. In an embodiment, the embedded PC CPU 100 may receive the definitions of test procedures through a different connection, such as through a serial interface or an USB interface. Numerous other means of receiving definitions of test procedures via various Interfaces are within the scope of the present disclosure and will readily suggest themselves to one skilled in the art.

The embedded PC CPU 100 may control the execution of test sequences by executing a generic test loop, customized by reading or analyzing the definition of a test procedure stored in the controller module 14. Test sequence operations may include sending data files to the VI generators 16, configuring the VI generators 16, responding to the programmable digital inputs, and driving the programmable digital outputs. Test sequence operations may include interrogating the relay under test 24 to determine the initial or "as found" settings of the relay under test 24, storing the as found settings of the relay under test 24, changing the settings of the relay under test 24. Test sequences may also include testing the relay under test 24, determining the status of the relay under test 24, furthermore determining the success or failure of the test of the relay under test 24, and restoring the as found settings into the relay under test 24. The test sequence operations may include changing the settings of the relay under test 24 to factory settings as a precondition for running the test.

The embedded PC CPU 100 generates a log of the execution of test sequences and of inputs, for example the programmable inputs from the timer CPU 102. The test sequence operations may include interrogating a relay to determine the settings of the relay under test 24, testing the relay according to a specific or generic test procedure which is customized by using the settings of the relay under test 24—this may be termed testing the relay under test 24 according to its settings or "as found" settings—and determining success or failure of the test.

The embedded PC CPU 100 may log the actions of the test sequences, the inputs, and the state changes of the relay under test 24 to memory 105. Thereafter, one or more test logs may be downloaded over one of the interfaces of the controller module 14. Alternately, the relay test device 10 may be transported to a laboratory, office, or shop to download one or more test logs for further analysis. The test logs may be printed out by a printer connected to the printer interface or to the USB interface. The test logs make it possible to accurately reproduce a test run, even if the test system default values are changed. The relay test device 10 may be in communication with other equipment employed in testing the relay under test 24, and the relay test device 10 may store in the test logs information provided by the other equipment.

Figure 4:
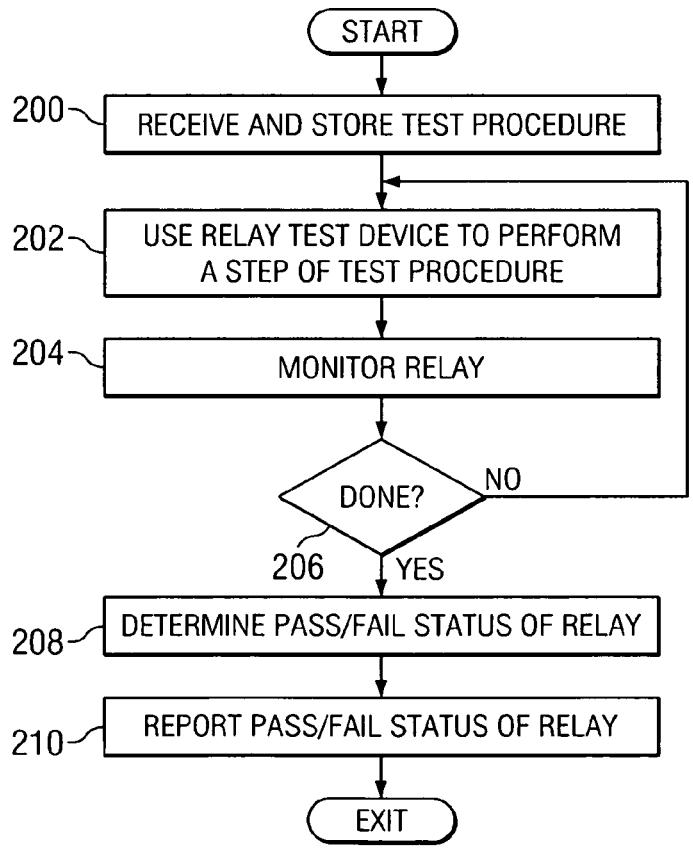
FIG. 4 is a flow chart illustrating one embodiment of a method for using the relay test device.

Turning now to FIG. 4, a method for using the relay test device 10 is depicted. At block 200 a test procedure is received and stored in the relay test device 10. The test procedure may have been defined or programmed by personnel skilled with protection relay systems and equipment and/or electrical power distribution technology and regulations. The test procedure describes a series of actions for the relay test device 10 to take to test the relay under test 24. The test procedure may include data, such as a DFR or a data table representing a periodic waveform. Alternately, data may be received by the relay test device 10 in a separate step after or before block 200. In an embodiment, the test procedure may be expressed in an advanced visual test software (AVTS) proprietary programming language. Single AVTS commands are expanded into several relay test system (RTS) commands, where RTS is another proprietary programming language. Single RTS commands are expanded into several commands to the VI generator 16 executable by the VI CPU 450 depicted in FIG. 10a. The commands to the VI generator 16 may be, for example, assembly language commands in the native language of the DSP 464. In another embodiment, the commands to the VI generator 16 may be based on a proprietary language scheme optimized for reducing data volume on the LVDS data bus 18, promoting test signal generation by desired characteristics of a test signal, such as relative phase to other VI generators 16, reference to an internal or external clocking source, change of frequency, change of amplitude, DC offset or voltage offset, start and stop control of the signals.

In an embodiment, the relay test device 10 may receive the test procedure or test procedure updates through communication with external devices, for example through Ethernet communication with a laptop computer. The test procedure may be downloaded to the relay test device 10 from a laptop computer in a lab, office, or shop, and the relay test device 10 may be transported thereafter to the field to test relays. In another embodiment, the relay test device may be temporarily resident at a remote location, such as an electrical substation location, and receive the test procedure updates downloaded through the Wide Area Network (WAN) from a PC or intranet or Internet or other type of file transfer capable data storage and retrieval site. In another embodiment, the relay test device 10 may receive the test procedure originating from a memory device such as a flash memory card integral to the embedded PC CPU 100, an optical disk inserted into an optical disk reader, a magnetic disk inserted into a magnetic disk reader, or an alternate media inserted into an alternate media storage device which may be integral to the relay test device 10.

The method proceeds to block 202 where the relay test device 10 is connected to the relay under test 24, the test procedure is started or initiated, and the relay test device 10 performs an action of the test procedure. A field operator without special knowledge of relays or electrical power distribution technology or regulations may transport the relay test device 10 to the field, connect the relay test device 10 to the relay under test, and initiate the test procedure. In an embodiment, the UI 20 may provide a depiction of a schematic drawing or a bit map digital image of, for example, a relay and patch cables connecting to the relay which facilitates connecting the relay under test 24 to the relay test device 10. The embedded PC CPU 100 may read an instruction of a computer program encoding the test procedure and, based on this instruction, command one or more VI generators 16 to output a test signal to the relay under test 24. Alternately, the embedded PC CPU 100 may command the timer CPU 102 to output a state on one of the programmed outputs. The VI generator 16 outputs a test signal to the relay under test 24 and/or the timer CPU 102 outputs a state on one of the programmed outputs to the relay under test 24.

The method proceeds to block 204 where the relay test device 10 monitors the relay under test 24. The relay test device 10 may monitor a plurality of indications of a state of the relay under test 24. In some embodiments, the relay test device 10 generates a log of the test actions and the indications of the state of the relay under test 24. The method proceeds to block 206 where the method returns to block 202 if the test of the relay under test 24 is incomplete. By looping through block 202 and block 204 the relay test device 10 sequences through the test procedure and tests the relay under test 24. In some test procedures, the relay test device 10 may generate a voltage or current signal which the relay test device 10 sends to the relay under test 24, such as the voltage and current signals which the VI generators 16 are capable of generating.

When the test of the relay under test 24 is complete, the method proceeds to block 208 where the relay test device 10 analyzes the final state of the relay under test 24 to determine whether the relay under test 24 passed or failed the test. The method proceeds to block 210 where the relay test device 10 reports the test result to the UI 20. In an embodiment, the log of the test actions and the indications of the relay may be stored in a file in memory 105 or memory storage device 103, and the file may be transferred to an external device, for example to a laptop computer via Ethernet communications. The log may be analyzed in more detail at a later time, for example in a corporate office or laboratory for the purpose of verifying pass or fail test results.

Figure 5:
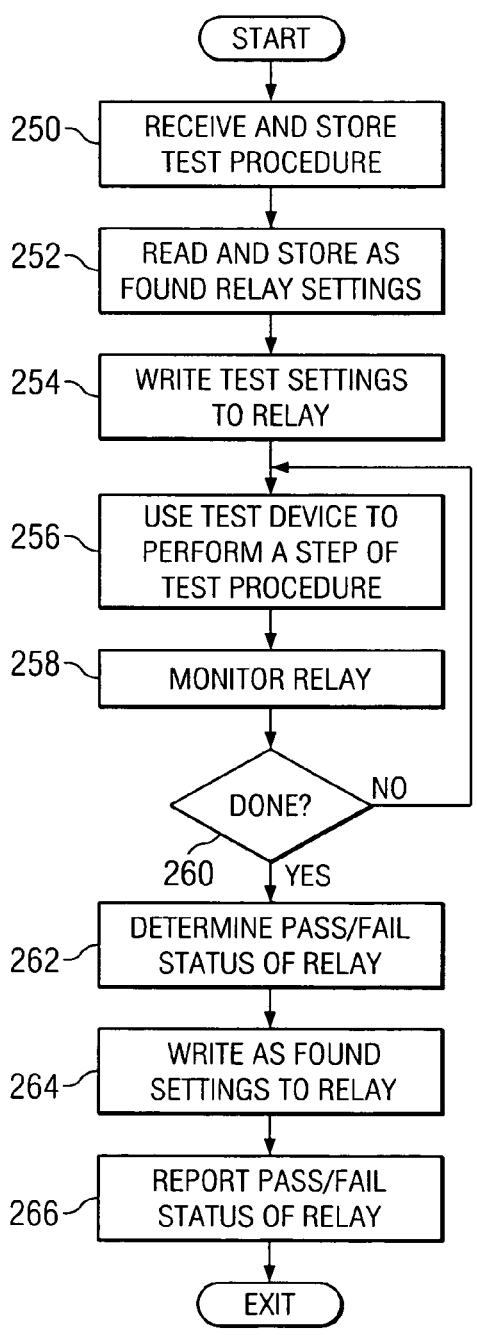
FIG. 5 is a flow chart illustrating another embodiment of a method for using the relay test device.

Turning now to FIG. 5, a method for using the relay test device 10 according to another embodiment is depicted. The method depicted in FIG. 5 is substantially the same as the method depicted in FIG. 4, with differences noted below. It is understood that after block 250 and before block 252 a field operator without special knowledge of relays or electrical power distribution technology or regulations may transport the relay test device 10 to the field, connect the relay test device 10 to the relay under test 24, and initiate the test procedure. At block 252 the relay test device 10 reads the initial settings, initial configuration parameters, or initial adjustments of the relay under test 24 from the relay under test 24. The relay test device 10 stores the initial settings otherwise known as "as found" data of the relay under test 24.

The method proceeds to block 254 where the relay test device 10 writes test settings to the relay under test 24. This action may be referred to as reprogramming the relay under test 24. In some cases, the test settings may be factory settings specified for the relay under test 24, or special test settings which ensure specific relay elements operate as expected, without influence from other relay test device 10 elements not of interest for the specific test applied. The method loops through blocks 256, 258, and 260 performing the test of the relay under test 24. At block 262 the relay test device 10 analyzes the final state of the relay under test 24 to determine whether the relay under test 24 passed or failed the test. The method proceeds to block 266 where the relay test device 10 writes the initial settings to the relay under test 24, to restore the relay under test 24 to its initial condition. The method proceeds to block 266 where the relay test device 10 reports the test result to the user interface 20.

Figure 6:
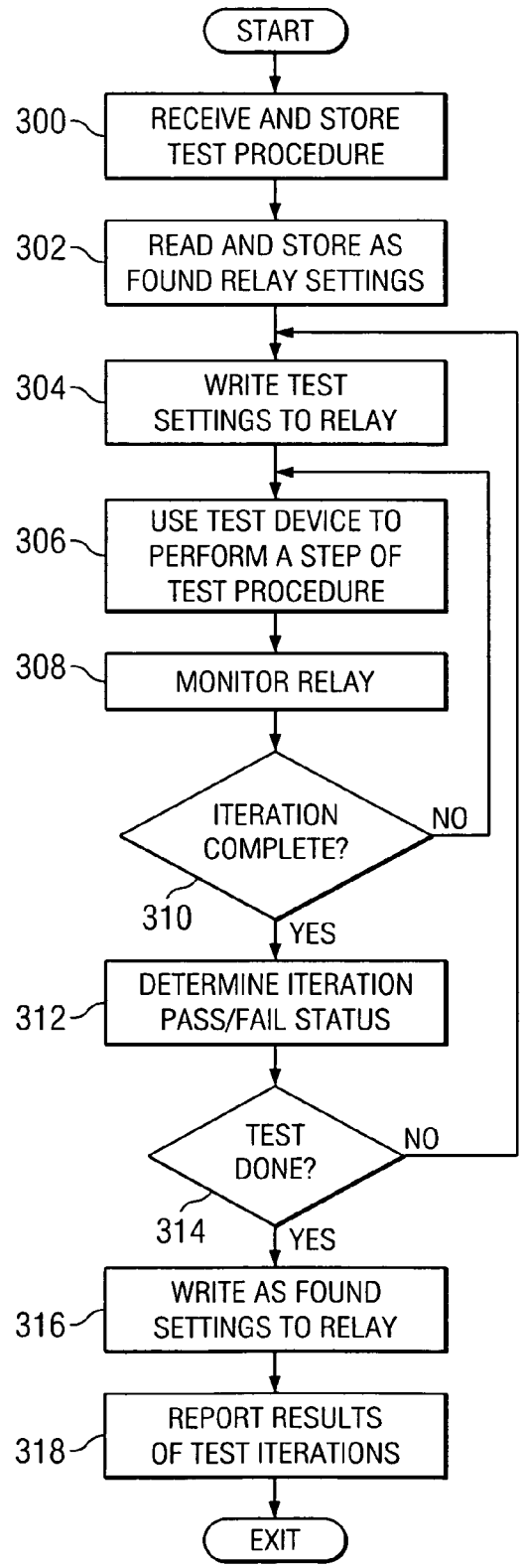
FIG. 6 is a flow chart illustrating another embodiment of a method for using the relay test device.

Turning now to FIG. 6, another method for using the relay test device 10 is depicted. The method depicted in FIG. 6 is substantially the same as the method depicted in FIG. 5 with differences noted below. It is understood that after block 300 and before block 302 a field operator without special knowledge of relays or electrical power distribution technology or regulations may transport the relay test device 10 to the field, connect the relay test device 10 to the relay under test 24, and initiate the test procedure. After testing the relay under test 24 according to a first group of relay settings, the method proceeds to block 312 where the relay test device 10 analyzes the state of the relay under test 24 to determine whether the relay under test 24 passed or failed the test according to the particular group of relay settings. The method proceeds to block 314 where the method returns to block 304 if the relay under test 24 has not been tested according to all groups of relay settings which the test procedure calls for testing. By looping through blocks 304, 306, 308, 310, and 312 the relay under test 24 is tested according to each of several test relay settings. At block 314 if the test of the relay under test 24 is complete, the method proceeds to block 316 where the relay test device 10 writes the initial relay settings to the relay under test 24, to restore the relay under test 24 to its initial condition. The method proceeds to block 318 where the relay test device 10 reports the test results to the UI 20.

Figure 7A:
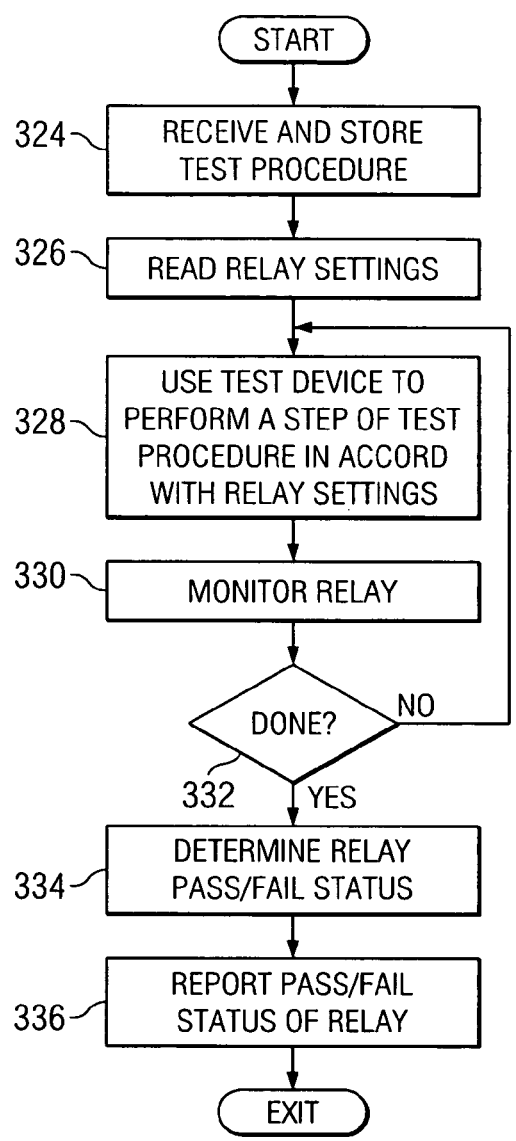
FIG. 7a is a flow chart illustrating another embodiment of a method for using the relay test device.

Turning now to FIG. 7a, another method for using the relay test device 10 is depicted. The method depicted in FIG. 7a is substantially the same as the method depicted in FIG. 4 with differences noted below. It is understood that after block 324 and before block 326 a field operator without special knowledge of relays or electrical power distribution technology or regulations may transport the relay test device 10 to the field, connect the relay test device 10 to the relay under test 24, and initiate the test procedure. At block 326 the relay test device 10 reads the as found relay settings. The method proceeds to block 328 where the test relay device 10 performs an action of the test procedure based on the as found relay settings which were read in. This step corresponds to testing the relay under test 24 according to its as found settings, and if a relay having different settings from another relay is tested using the same test procedure stored in the relay test device 10, the test actions will differ accordingly.

Figure 7B:
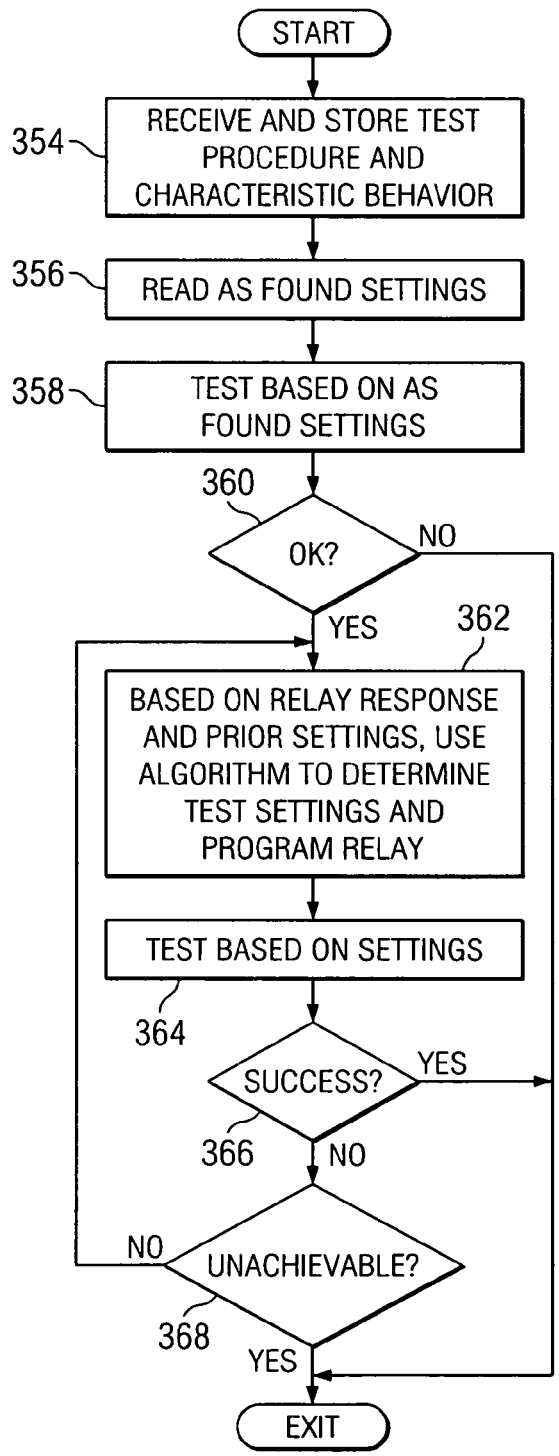
FIG. 7b illustrates another method for employing the relay test device according to another embodiment.

Turning now to FIG. 7b, another method for using the relay test device 10 is depicted. The method depicted in FIG. 7b is substantially the same as the method depicted in FIG. 4 with differences noted below. It is understood that after block 354 and before block 356 a field operator without special knowledge of relays or electrical power distribution technology or regulations may transport the relay test device 10 to the field, connect the relay test device 10 to the relay under test 24, and initiate the test procedure. At block 354 the procedure step contains both a test procedure and a new desired characteristic behavior of the relay under test 24 based on settings to be determined by test. At block 356 the relay test device 10 reads the initial relay settings.

The method proceeds to block 358 where the test relay device 10 performs an action of the test procedure based on the as found relay settings which were read in. The method proceeds to block 360 where if the relay under test 24 passes the test with expected results, the relay can then be re-programmed with new settings which may cause the relay under test 24 to exhibit the desired characteristic stored in block 354. Assuming the results of the testing at block 358 were successful, the method proceeds to block 362.

In block 362 a search algorithm determines relay settings that may lead the relay under test 24 to exhibit the desired characteristic when tested. The search algorithm may be designed to approach the settings that produce the desired characteristic by determining a succession of maximum and minimum settings and refining the maximum and minimum settings each iteration through the test loop. Alternately, another algorithm for finding relay settings suitable for testing the relay under test 24 may be employed. The relay under test 24 is reprogrammed with the determined relay settings utilizing Ethernet, RS-232 or other communications means used by industry standard relays.

The method proceeds to block 364 where the relay under test 24 is tested according to the settings. The method proceeds to block 366 where if the relay under test 24 exhibited the desired characteristic the test is successful and the method exits. If the relay under test 24 did not exhibit the desired characteristic, the method proceeds to block 368. In block 368 if the characteristic is determined to be unachievable, for example if a maximum number of test iterations have completed without achieving the desired characteristic, the method exits otherwise the method returns to block 362.

By looping through blocks 362, 364, 366, and 368 the relay under test 24 is tested according to a number of settings to find if the desired characteristic can be achieved.

The settings required and actual characteristics of the relay under test 24 are logged into memory or sent via network communications to a data storage system, such as a PC or web server for analysis by personnel skilled in the art of protective relay settings, application and testing.

The relay test device 10 provides a stand-alone test set which may be used by personnel with relatively limited knowledge and experience of relays and electrical power distribution. The relay test device 10 may simplify the complex field test procedures associated with other test devices down to procedures involving pointing and clicking by field service personnel which causes complete tests to run and test results to be reported. In an embodiment, the relay test device 10 may support initiating tests from and displaying and analyzing results on a general purpose computer system, such as a personal computer or a workstation, for example in a manufacturer's relay test shop. In another embodiment the relay test device 10 may utilize network communications, such as Ethernet, Internet, intranet or wireless networks, to support initiating tests from and displaying results on a general purpose computer system, such as a personal computer or workstation while the relay test device 10 is located remotely from the general purpose computer system, such as relay test device 10 located at an electrical distribution substation hundreds or thousands of miles away from the general purpose personal computer located at a main service office where skilled personnel may be consolidated to reduce costs, utilizing less expensive field personnel for traveling from site to site and connecting relay test device 10 to relays under test 24. Software loaded on a personal computer, workstation, or the relay test device 10 may be used to create, analyze, and perform relay tests.

Software and Firmware Installation System for a Relay Test Device

Installing versions of software and firmware into the relay test device 10 may involve changing the stored instructions associated with DSPs, PLDs, ASICs, uPs, and uCs inside the relay test device 10 and in the UI 20. The versions of software and firmware may be updates, functional corrections, revisions, prior versions, and/or new versions. The versions of software may include test procedures. All of these software and firmware changes or installations are contemplated by the use of the term version or installation. Installing versions of software and firmware may entail installing the versions into memory in a specific order. In one embodiment, the relay test device 10 may initiate contact with a remote computer system in the event of a failure or for upgrading or updating. Communication could also be initiated by the remote computer system, such as a support computer maintained by the device vendor. Either or both the remote computer system or relay test device 10 may perform a diagnostic analysis of the relay test device 10 to determine the versions or levels of the firmware on the relay test device 10. Diagnostic information may include a serial number or other identifier for the relay test device 10, serial numbers or identifiers for each of the programmable modules and programming instructions or firmware levels currently on the relay test device 10. These identifiers may be communicated in a file and/or stored on the relay test device 10 and/or the remote computer system. In the event a new module, updated instruction, or firmware level is loaded onto the relay test device 10 to fix a particular problem, for example, a complete update to all systems within the relay test device 10 may be warranted based on an analysis of the diagnostics of other firmware levels. Also, the remote computer system may maintain a list of the relay test devices 10 whose owners pay for technical support and updates may only be provided based on support agreements. The relay test device 10 may provide users a notice where an update is unavailable because no technical support agreement with the vendor is in place.

Because many of the behaviors of the relay test device 10 are commanded or determined by software and firmware, installing versions of software and firmware can change the basic function of the relay test device 10, including changing the basic function to perform tests of devices other than electrical power protection relays. For example, the relay test device 10 may be reprogrammed to test stepper motors, solenoids, hydraulic pumps, and other devices requiring a powerful voltage and/or current signal to be tested. The embedded PC CPU 100 may receive the versions of software and firmware through network connections, for example an Ethernet connection to a LAN, and stores the versions of software and firmware.

Turning now to FIG. 8, an embodiment of a software and firmware installation system for the relay test device 10 is depicted. The relay test device 10 includes an installation control component 420 in communication with a plurality of CPUs 422—a first CPU 422a and a second CPU 422b. The installation control component 420 and the CPUs 422 may comprise one or more DSPs, FPGAs, PLDs, CPLDs, ASICs, uPs, and uCs. Each of the CPUs 422 are associated with an installation routine 424—the first CPU 422a is associated with a first installation routine 424a and the second CPU 422b is associated with a second installation routine 424b. The control module 420 is associated with a third installation routine 424c. Each of the CPUs 422 and the installation control component 420 execute software or firmware, which may be referred to as programs, out of one or more program memory 426 to accomplish their basic functions, for example testing a relay under test 24.

The program memory 426 may be non-volatile memory including EPROM, EEPROM, Flash, and/or other non-volatile reprogrammable memory. The program memory 426 may have precise real-time programming requirements. For example, an EEPROM may need to have a particular sequence of binary words written to it to disable a write-protected mode and then the EEPROM may need to be written to at least every 3 mS or the EEPROM may revert to write-protected mode. It is understood that this programming protocol is only exemplary and that other programming protocols may apply to other program memory 426. The first CPU 422a is associated with a first program memory 426a-1, a second program memory 426a-2, and a third program memory 426a-3. The second CPU 422b is associated with a fourth program memory 426b-1, a fifth program memory 426b-2, and a sixth program memory 426b-3. The control component 420 is associated with a seventh program memory 426c. The programs stored in the program memory 426 provide much of the functionality of the relay test device 10. The installation routines 424 contain instructions for installing versions of software or firmware into the one or more program memory 426.

In one embodiment a version oracle file may be provided which describes the versioned programs 428 that are available, the interdependencies that exists among the versioned programs 428, the installation sequence that is mandatory for particular combinations of versioned programs 428, and other information pertinent to installing versioned programs 428. The third installation routine 424c may download the version oracle file from an FTP site, process the version oracle file, and perform an installation of versioned programs 428 based on processing the version oracle file.

A plurality of versioned programs 428—a first versioned program 428a, a second versioned program 428a-2, a third versioned program 428a-3, a fourth versioned program 428b-1, a fifth versioned program 428b-2, a sixth versioned program 428b-3, and a seventh versioned program 428c—may be provided to the installation control component 420 or stored/saved elsewhere. The versioned programs 428 may be versions of the programs stored in the program memory 426. The installation control component 420 may receive the versioned programs 428 through communications, for example through Ethernet communication with a laptop computer or using the file transfer protocol (FTP) to access a FTP storage site via the Internet. The installation control component 420 may receive the versioned programs 428 through communication such as, but not limited to, with an optical disk reader, with a magnetic disk reader, or with another media storage device using an alternate media which is part of the relay test device 10.

The installation control component 420 is operable to install the versioned programs 428 by communicating the versioned programs 428 to the appropriate CPUs 422 and by causing the installation routines 424 to be executed, installing the versioned programs 428 into the appropriate program memory 426. This process may include executing the first installation routine 424a to install the versioned programs 428a-1, 428a-2, and 428a-3 into program memory 426a-1, 426a-2, and 426a-3 associated with the first CPU 422a. This process may include executing the second installation routine 424b to install the versioned programs 428b-1, 428b-2, and 428b-3 into the program memory 426b-1, 426b-2, and 426b-3 associated with the second CPU 422b. This process may include executing the third installation routine 424c to install the seventh versioned program 428c into the seventh program memory 426c associated with the control module 420.

The first installation routine 424a and the second installation routine 424b may be required to meet the precise programming protocols associated with the program memory 426. In an embodiment where tight programming timing protocols may not be associated with the program memory 426, the third installation routine 426c may directly control the installation of versioned programs 428a-1, 428a-2, and 428a-3 on the program memory 426a-1, 426a-2, and 426a-3 and the installation of versioned programs 428b-1, 428b-2, and 428b-3 on the program memory 426b-1, 426b-2, and 426b-3. In this embodiment, there may be no need of the first installation routine 424a and the second installation routine 424b.

Furthermore, additional programmable devices 422, for example an FPGA 422c and a CPLD 422d, may be in indirect communication with the installation control component 420. The exemplary FPGA 422c is in communication with the first CPU 422a and indirectly with the installation control component 420 via the first CPU 422a. The exemplary CPLD 422d is in communication with the FPGA 422c and indirectly in communication with the first CPU 422a via the FPGA 422c. In an embodiment, it may be desirable to install the versioned program 428 into the CPLD 422d before installing the versioned program 428 into the FPGA 422c. If a new communication mechanism is deployed in the versioned programs 428, the CPLD 422d and the FPGA 422c may not be able to communicate when they execute according to incompatible versioned programs 428. If the CPLD 422d is updated first, the FPGA 422c may not be able to communicate with the CPLD 422d, but the FPGA 422c may still be able to be updated. If the FPGA 422c is updated first, the FPGA 422c may not be able to communicate with the CPLD 422d and hence the CPLD 422d may be isolated and incapable of being updated. The CPLD 422d and the FPGA 422c may be updated by the first installation routine 424a associated with the first CPU 422a. In an alternate embodiment, the CPLD 422d and the FPGA 422c may be associated with their own installation routines 424, not shown, and may execute their own installation routines to effect the installation of the versioned program 428.

When the operating system executes out of RAM, the third installation routine 424c may install a version of the operating system into the program memory 426 associated with the embedded PC CPU 100, and when the embedded PC CPU 100 reboots, the version of the operating system recently installed is executed.

The software and firmware installation system for the relay test device 10 may be employed to support delivery of test procedures to customers. For example, a test procedure for a newly released relay may be developed by the manufacturer of the relay test device 10. The manufacturer may provide the software encoding that includes the new test procedure to customers who own the relay test device 10. The customer, having acquired access to the software encoding of the new test procedure may download the software encoding from a FTP site where the manufacturer stores the software encoding of the new test procedure and install the software into the relay test device 10. The downloading and installation may be conducted employing the software and firmware installation system described above.

In another embodiment, the software and firmware installation system for the relay test device 10 may be employed to support delivery of test procedures to customers of the relay under test 24. For example, a test procedure for a newly released relay may be developed by the manufacturer of the relay under test 24. The manufacturer of the relay under test 24 may provide the software encoding that includes the new test procedure to customers who own the relay test device 10. The customer, having acquired access to the software encoding of the new test procedure may download the software encoding from a FTP site where the manufacturer of the relay under test 24 stores the software encoding of the new test procedure and install the software into the relay test device 10. The downloading and installation may be conducted employing the software and firmware installation system described above.

Once downloaded from the FTP site and installed in this manner, the customer derives value from the software by testing the relay under test 24 using the software. It may be more efficient for the manufacturer of the relay test device 10 to develop software encoding relay test procedures once and sell or provide this software to, for example, five power distribution operating companies, than for each of the five power distribution operating companies to develop their own software encoding relay test procedures for the relay test device 10.

The software and firmware installation system for the relay test device 10 may be employed to support delivery of bug fixes using a simple point and click interface, such as a touch screen or standard monitor and mouse found on many PCs. The third installation routine 424c may respond to the activation of a bug fix selection by first downloading the version oracle file discussed above and use the version oracle file to determine what versioned programs 428 to download from the FTP site and how to install these versioned programs 428.

The basic function of the relay test device 10 may be changed by installing versioned programs 428. For example, by installing versioned programs 428 the relay test device 10 could be reprogrammed to test a motor bank. Versioned programs 428 including a test procedure and/or a computer program may be installed that control spinning up three motors from 0 revolutions per minute (RPM) to 400 RPM over ten minutes while the three motors run synchronously and differ from each other by no more than one revolution over the entire test run. The motors may provide tachometer signals to the programmed inputs of the relay test device 10 and forwarded to the three VI generators 16a, 16b, and 16c.

The three VI generators 16a, 16b, and 16c may be reprogrammed by installing a versioned program 428 to use the tachometer signals to generate voltage and/or current output signals to drive the motors. This is an exemplary scenario of reprogramming the relay test device 10 to perform activities other than relay testing. Other alternate employments for the relay test device 10 are also contemplated by the present disclosure, including for example, but not limited to, using the relay test device 10 to control and/or test stepper motors, solenoids, hydraulic pumps, and submersible pump motors.

Figure 9:
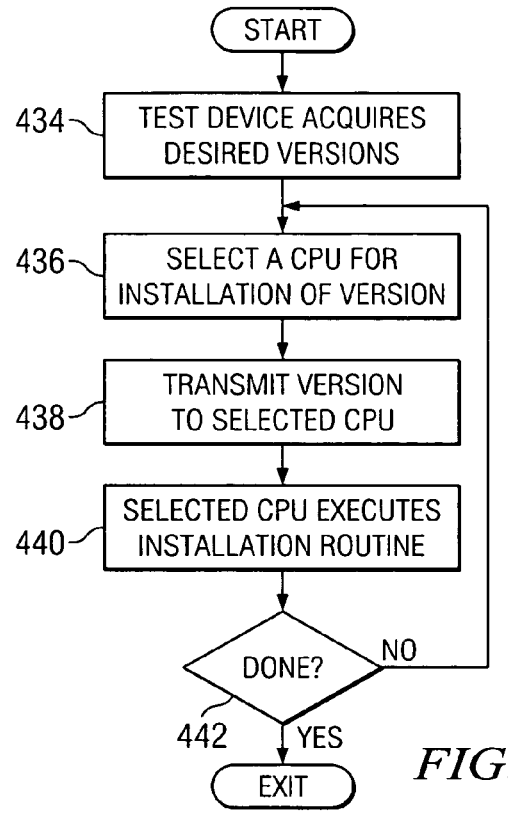
FIG. 9 is a flow chart illustrating a method for using a system for installing software and/or firmware versions in the relay test device.

Turning now to FIG. 9, a method of installing software and firmware into the relay test device 10 is depicted. In block 434 one or more versioned programs 428 for one or more CPUs 422 are transmitted to the relay test device 10. The CPUs 422 may be DSPs, CPLDs, FPGAs, uPs, microcontrollers (uC), and/or ASICs. The versioned programs 428 may be software versions or firmware versions. The versioned programs 428 may be selected based on information obtained from a version oracle file described above which has been downloaded from an FTP site or based on information provided by another means. The method proceeds to block 436 where one of the versioned programs 428 is selected for installation in program memory 426. In an embodiment, it may be prudent to follow a particular sequence for installing the versioned programs 428. Installing versioned programs 428 into the program memory 426 at the end of communications paths first, installing versioned programs 428 into the program memory 426 in the middle of communications paths next, and so on, in order to avoid isolating one of the CPUs 422 which is unable to communicate with any other CPU 422 and hence cannot install the versioned programs 428 associated with that isolated CPU 422. The appropriate sequence for installing versioned programs 428 may be specified by the version oracle file or by another means.

The method proceeds to block 438 where one of the versioned programs 428 is transmitted to the selected CPU 422. The method proceeds to block 440 where the selected CPU 422 executes an installation routine 424. In an embodiment, the selected CPU 422 writes the versioned program 428 to the program memory 426, such as a rewriteable static memory device, such as an electrically erasable programmable read only memory (EEPROM), a flash memory, or other rewriteable static memory device.

The method proceeds to block 442 where if all the versioned programs 428 have not been installed the method returns to block 436. By looping through blocks 436, 438, 440, and 442 each of the versioned programs 428 is successively installed. When all versioned programs 428 have been installed, the method exits. Note that an installation control component 420 may execute an installation routine 424 for installing versioned programs 428 on other CPUs 422 and install versioned programs 428 on itself as the last action of the installation. For example, the controller module 14 may install versioned programs 428 in each of the VI generators 16 and as the last step of a revision procedure install versioned programs 428 associated with the controller module 14.

Returning to FIG. 3, the timer CPU 102 may comprise one or more DSPs, FPGAs, PLDs, CPLDs, ASICs, uPs, uCs, or a combination thereof. The timer CPU 102 is in communication with one or more memory devices, the programmable digital inputs, the programmable digital outputs, and the PC CPU 100. The memory devices may include RAM, ROM, EPROM, EEPROM, and Flash memory devices. The programmable digital inputs and outputs provide timing and logic operations in real-time coordinated with a plurality of outputs of the VI generators 16. The programmable digital inputs may monitor the operation of relay contacts of the relay under test 24 or monitor voltages applied, removed or changed, as expected or designed in a power distribution protection system test environment.

The programmable digital outputs may simulate adjacent relay logic, or other contact closure events normally found in a power distribution protection system to the relay under test 24. The programmable digital outputs may be used to test circuit breaker event schemes, such as ground faults or multiple relay contact closures associated with reclosing relays. The programmable inputs and outputs may be programmed, using Boolean logic, for more complex power system simulations, including vector directed test sequences based on logical AND, OR, NOT, TRUE and FALSE operations, and combinations thereof. For example, the Boolean Logic may be programmed to wait for an event such as "AND" on two or more of the input monitoring posts. The logic will determine if an event on monitoring post input one and monitoring post input two are both TRUE, then the logic result is TRUE and the condition is satisfied to proceed to the next step in the program. Another example may include a Boolean Logic case statement controlling an output which may be conditionally determined by the states of the inputs, time, and step in a procedure or program. For example: If input 1=TRUE AND input 2=TRUE OR input 1=TRUE and input 3=FALSE AND procedure step=17 Output contact 3=FALSE, Output contact 1=TRUE. This Boolean logic capability provides the increased flexibility and complexity of test, such as operation based on conditions that may change during the course of application or testing.

Electric power generation facilities and electrical power distribution substations are examples of the environments where the relay test device 10 may be employed. These environments may have high levels of electromagnetic interference (EMI). High EMI levels can cause unreliable communication between physically separated electronic devices and even between electronic components located within the same enclosure. High EMI levels may be particularly problematic when high data communication rates are used, as they are between the embedded PC CPU 100 and the UI 20 and between the PC CPU 100 and the VI generators 16.

LVDS signaling provides a standards-based approach to providing reliable communication in a noisy environment. The basic principle of operation of LVDS is to send a binary signal as the difference between voltage levels on two signal lines rather than as the voltage on a single signal line referenced to a chassis ground. If EMI or noise interferes with the two signal lines, both lines should be equally perturbed and in the same sense. For example, if line 1 has a voltage of 1 volt, line 2 has a voltage of −1 volt, and both lines are temporarily interfered with to raise their voltage 2 volts to 3 volts on line 1 and 1 volt on line 2, the voltage difference between line 1 and line 2 remains unchanged, and the differential signal remains correct. If a single logic line 3 has a voltage of 0.2 volts, and this single logic line 3 is interfered with to raise its voltage 2 volts to 2.2 volts, this may be deemed to have changed the logic level of the signal, referenced to chassis ground, from a logic 0 or low logic to a logic 1 or high logic, thus corrupting the signal. Other approaches to providing reliable communications in a high EMI environment are also contemplated including using shielded media, optical communication, spread spectrum wireless communication, orthogonal frequency division multiplexing (OFDM), wireless communication, higher voltage level communications, increasing the signal to noise ratio produced using voltage translators, and infrared communication.

Modular Signal Generator, including Real-time Signal and Waveform Generation

Figure 10A:
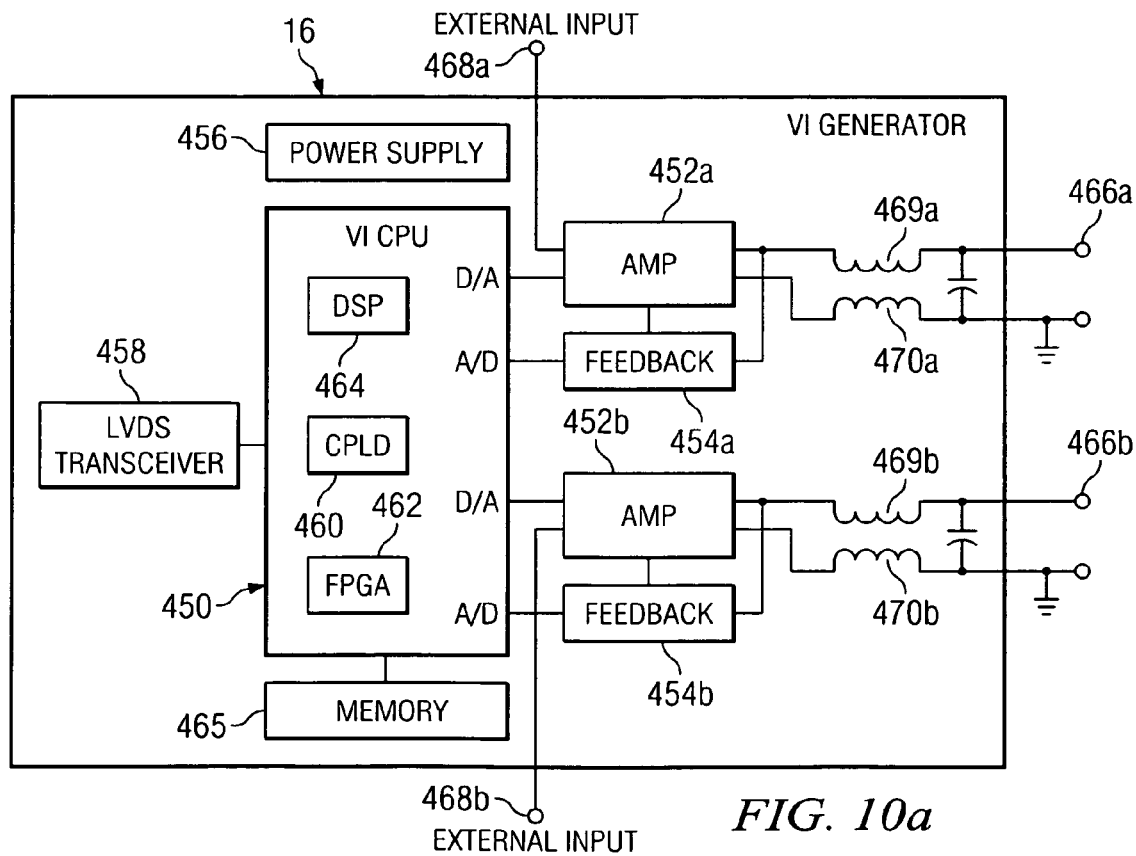
FIG. 10a is a block diagram of one embodiment of a signal generator for use in the relay test device.

Turning now to FIG. 10a, a block diagram of the VI generator 16 is depicted. In this embodiment, the VI generator 16 includes a VI CPU 450, two amplifiers 452—a first amplifier 452a and a second amplifier 452b—two feedback components 454—a first feedback component 454a and a second feedback component 454b—a VI power supply 456, and a second LVDS transceiver 458. Each amplifier 452 is associated with an output 466—a first output 466a associated with the first amplifier 452a and a second output 466b associated with the second amplifier 452b. External inputs 468a and 468b are available for feeding signals to one of the amplifiers 452a and 452b, respectively.

The external input 468 may be optional because an input to the amplifier 452 may be sourced by the VI CPU 450 or, optionally, by the external input 468 which is supplied by an external signal, such as an analog signal played back on a recorder device. The input 468 may be routed to the VI generator 16 from the backplane 12. Alternately, the input 468 may route directly to the VI generator 16. In an embodiment, a digital to analog converter (DAC) (not shown) may be provided between the VI CPU 450 and the amplifier 452 in another embodiment, the DAC may be integrated with the amplifier 452. While the preferred embodiment of the VI generator 16 provides two amplifiers 452, two feedback components 454, and two outputs 466, in other embodiments there may be more or fewer amplifiers 452, feedback components 454, and outputs 466.

The VI generator 16 is a modular component. VI generators 16 are interchangeable, and, for example, if the first VI generator 16a fails, the controller module 14 may configure the fourth VI generator 16d to provide the same or similar functions that the first VI generator 16a was providing when the first VI generator 16a failed. The ability of the relay test device 10 to experience a failure of one VI generator 16, for example the first VI generator 16a, and to continue field testing, as for example by reconfiguring the test procedure to employ the fourth VI generator 16d in the place of the first VI generator 16a, provides significant utility.

The modularity of the VI generator 16 supports a maintenance concept of removing a failed VI generator 16, which may be implemented as a circuit board or circuit card, for example, and sending the failed VI generator 16 back to the manufacturer for repair. Meanwhile the relay test device 10 may continue to be used in the field or in the shop testing the relay under test 24 using the remaining generators 16 that are operational. The VI generators 16 may be considered modular based on its unitary or self-contained nature, or based on the ease with which each one of the VI generators 16 may, in one embodiment, be easily coupled and uncoupled from the relay test device 10.

This maintenance concept supports a customer purchasing a spare VI generator 16 and keeping it in reserve to replace a failed VI generator 16. In the case that a customer owns multiple relay test devices 10, the customer may purchase less than one spare VI generator 16 per relay test device 10 to keep in reserve, based on a calculation of a mean time between failures and a mean time to repair for the VI generator 16, as is well known to those skilled in the logistics support art. For example, a customer owning ten relay test devices 10 may calculate that purchasing three spare VI generators 16 reduces their risk over one year of any relay test device 10 having to operate with less than a full complement of signal generators to less than 5%. This scenario is exemplary. The redundant VI generator 16 also allows the customer the option to wait until the repaired or new VI generator 16 is received from the manufacturer.

The VI CPU 450 may comprise one or more DSPs, FPGAs, PLDs, CPLDs, ASICs, uPs, uCs, or a combination thereof. The software and/or firmware may be installed in the VI CPU 450 according to the installation system described above and referencing FIG. 4. In an embodiment, the VI CPU 450 comprises a CPLD 460, a FPGA 462, and a DSP 464. Placing a dedicated processor, the VI CPU 450, on each VI generator 16 permits one VI generator 16 to fail, for example the first VI generator 16*a*, while the other VI generators 16, for example the second VI generator 16*b*, the third VI generator 16*c*, and the fourth VI generator 16*d*, continue to operate normally. Placing a dedicated processor, the VI CPU 450, on each VI generator 16 permits generation of output signals from complex real-time calculations, which provides functional flexibility to the relay test device 10. Generation of output signals is discussed in greater detail hereinafter.

The VI CPU 450 is coupled to memory devices, such as a VI memory 465, which may include ROM, RAM, EPROM, EEPROM, and flash memories. The VI CPU 450, through the second LVDS transceiver 458, is in communication with the embedded PC CPU 100 and the Timer CPU 102 via the LVDS data bus 18 and the first LVDS transceiver 104. In another embodiment, LVDS Is not employed and the LVDS data bus 18 is replaced with an alternate bus architecture. The VI CPU 450 executes software and/or firmware operable to respond to control inputs, for example from the controller module 14, and to generate one or more signals, for example output 466, to send to the amplifiers 452.

The VI CPU 450 also executes software and/or firmware to monitor overheat condition, waveform distortion, under-voltage condition and over-current condition by utilizing respective detectors associated with the amplifiers 452 and power supply 456. The VI CPU 450 may take action on a fault condition, such as removing DC power from the amplifiers 452 when an overheat condition exists. The VI CPU 450 also sends control signals to the amplifiers 452, including voltage and current output level controls. In an embodiment, the embedded PC CPU 100 configures the VI CPU 450 with a group of signal parameters. The feedback component 454 may provide an analog feedback to the amplifier 452 which the amplifier 452, or other analog feedback control circuitry (not shown), employed to adjust the output 460 to the appropriate level using analog closed loop feedback control techniques. The feedback component 454 also provides digital feedback to the VI CPU 450. The feedback component 454 or a separate analog-to-digital converter (not shown) may convert the analog feedback to the digital representation for transmission to the VI CPU 450. The VI CPU 450 employs the digital feedback to adjust the signal sent by the VI CPU 450 to the amplifier 452 to drive the output 460 to the appropriate level using digital closed loop feedback control techniques. The use of both an analog feedback loop and a digital feedback loop provide for a more accurate output than either an analog feedback loop by itself or a digital feedback loop by itself.

The VI power supply 456 is directly connected to the alternating current (AC) power mains (not shown) within the relay test device 10. The AC power mains receive power from, for example, a power cord and plug connected to external utility power. Placing the VI power supply 456 on each VI generator 16 permits one VI generator 16 to fail, for example the first VI generator 16*a*, while the other VI generators 16, for example the second VI generator 16*b*, the third VI generator 16*c*, and the fourth VI generator 16*d*, continue to operate normally. Series-aiding output chokes 469 are used to filter digital power amplifier switching noise from the output 466 and couples the return signal currents back to the amplifier 452 via a second winding of choke 469. The amplifier output 452 is connected to the choke 469 input and the choke output is connected to the output 466. The amplifier 452 floats in reference to ground potential, and is removably referenced to ground at the output of choke 469.

The amplifier 452 boosts the level of input signals to the levels required to test relays. In one embodiment, the first amplifier 452*a* is a current generator rated to produce a 200 VA power level and the second amplifier 452*b* is a voltage generator rated to produce a 150 VA power level. In other embodiments, the amplifiers 452 may be rated to produce maximum power outputs in the range 50 VA to 500 VA. The second amplifier 452*b* may be convertible to a current generator. In other embodiments, other amplifier specifications may be supported. The output levels of the amplifiers 452 may be selectable to two or more range levels, for example a high amplification level and a low amplification level. The amplifier 452 may be sourced from the VI CPU 450 or from the optional input 468. In one embodiment, the amplifier 452 may be controlled to output of voltage or current, or a constant power level into a varying external load.

Figure 10B:
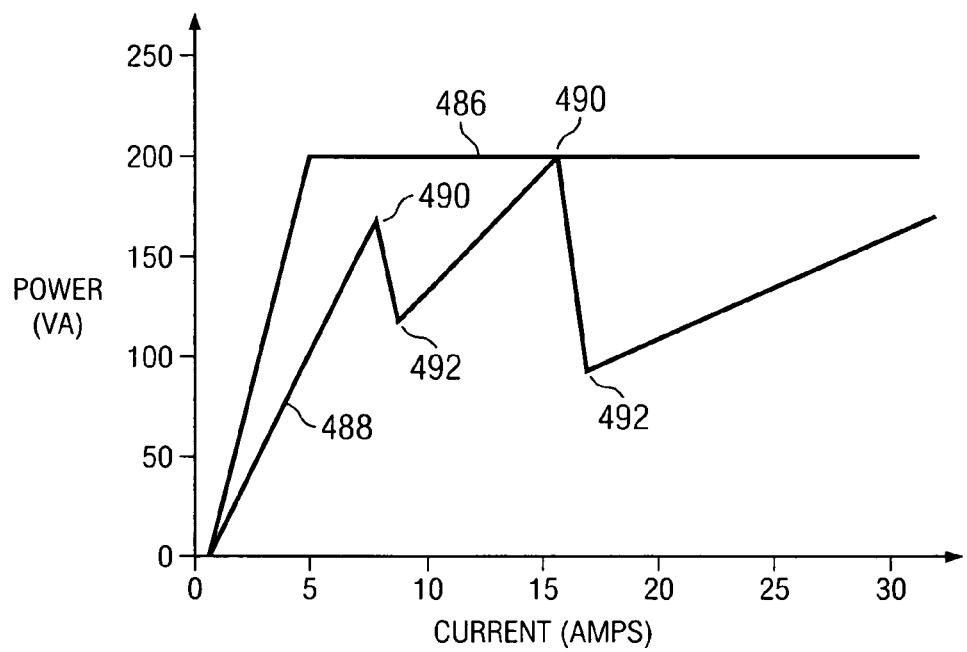
FIG. 10b is a graph of a constant power output according to an embodiment of the present disclosure.

Now turning to FIG. 10*b*, in one embodiment, the present disclosure enables the constant power output 486 which provides a significant utility and simplicity to the test process with the capability to deliver a known constant or linear power output to the relay under test 24. In one example, a test engineer may desire to test the relay under test 24 at multiple tap positions. The first tap may require 2 amps at 100 volts. The second tap may require 5 amps at 40 volts. The third tap may require 10 amps at 20 volts. Without this capability of the voltage and current generators, the output is not linear nor constant 488. It may have several operational high points 490 and low points 492 in output performance curves, where the rated output power only exists in restricted current, voltage or frequency values. In other combinations of voltage, current or frequency, a great disparity of rated power and actual delivered power may exist. This means the test engineer will need to consult a table of performance for the relay test system, and determine if the system output is sufficient to perform the test. In the preferred embodiment, the constant output power 486 assures the combination of voltage and current will always yield the constant output power 486 if needed. No complex calculations or performance tables are necessary, the voltage, current and thus power values may be calculated mathematically.

Figure 11:
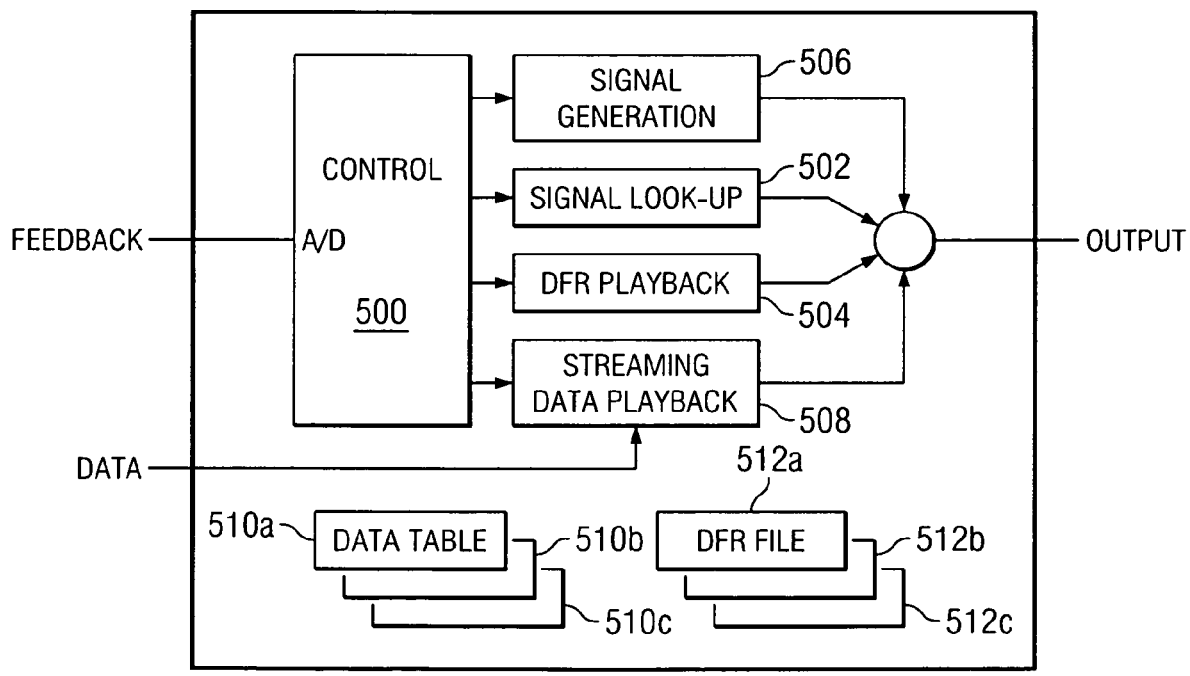
FIG. 11 is a block diagram of several functional components within the signal generator of the relay test device.

Turning now to FIG. 11, a block diagram depicts a portion of the software components operating on the VI CPU 450. A control component 500 is in communication with and controls a signal look-up component 502, a DFR playback component 504, a signal generation component 506, and a streaming data playback component 508. The signal look-up component 502 is associated with a plurality of data tables 510—a first data table 510a, a second data table 510b, and a third data table 510c—each containing data representing a periodic signal. Feedback from the output of one of the amplifiers 452 may provide input to the control component 500. In an embodiment, the analog feedback from the output of one of the amplifiers 452 is converted to 16 bits of digital feedback. The analog-to-digital conversion may be provided by the control component 500 or by some analog-to-digital converter, not shown, between the amplifier 452 and the control component 500. In other embodiments, either more than 16 bits or less than 16 bits of digital feedback may be employed. The control component 500 may employ the feedback to generate control signals in accordance with closed loop feedback control algorithms known to one skilled in the art. The DFR playback component 504 is associated with a plurality of DFR files 512—a first DFR file 512a, a second DFR file 512b, and a third DFR file 512c—each containing data representing a digital fault recording. The control component 500 selects, configures, and controls one or more of the signal look-up component 502, the DFR playback component 504, the streaming data playback component 508, or the signal generation component 506 based on communication received from the controller module 14.

In an embodiment, the signal look-up component 502, the DFR playback component 504, the streaming data playback component 508, and the signal generation component 506 produce a digital signal which is output to the amplifier 452 to be amplified. In another embodiment, the signal look-up component 502, the DFR playback component 504, the streaming data playback component 508, and the signal generation component 506 produce digital signals that may be summed together or otherwise combined, as for example mixing, and the summed or combined digital signal is output to the amplifier 452 to be amplified. The digital signal is converted to an analog signal by a DAC within the amplifier 452 or by a DAC (not shown) between the VI CPU 450 and the amplifier 452. The digital signal, taken at a particular time, is a number which proportionally represents the amplitude of a desirable voltage or current signal at that particular time. The control component 500 periodically commands that the number be determined, for example at a 14.4 kHz periodic rate and hence approximately every 69.4 microseconds (uS) which may be termed the calculation period. The 14.4 kHz periodic rate may be established by a clock interrupt being presented to the VI CPU 150 every 69.4 uS. The control component 500 may run inside a clock interrupt service routine which is invoked when the clock interrupt is presented to the VI CPU 150 450.

In one embodiment, the VI generators 16 synchronize to a master clock generated by the controller module 14. However, since the signal generation component 506 is a mathematical derivation of Master Clock (MT1)=Vigen Signal Time (VST1)+n1, where n1 is the deviation desired from MT1. The output signal can be skewed in phase based off of the reference of the master clock, such as one output phase staying synchronous with the master (MT1=VST1), creating a 60 Hz sine wave, and the other skewing in phase, perhaps 30 degrees, so VST1=MT1+n1 happens just once, thereafter VST1=MT1+the single quantity of n1, providing a time delay resulting in a phase skew that does not change. To further skew phase in relation to the Master Clock (MT1) another mathematical expression of n is derived to yield the change in phase desired, such as VST1=MT1+n1+n2. Another application of this would be a frequency ramp, whereas VST1=MT1+n1, whereas the addition of n1 is applied at every interrupt (i), so after three interrupts the sample point is output as VST1=MT1+n1*(3*i)). To return to the master clock, VST1 is set to MT1.

Figure 12:
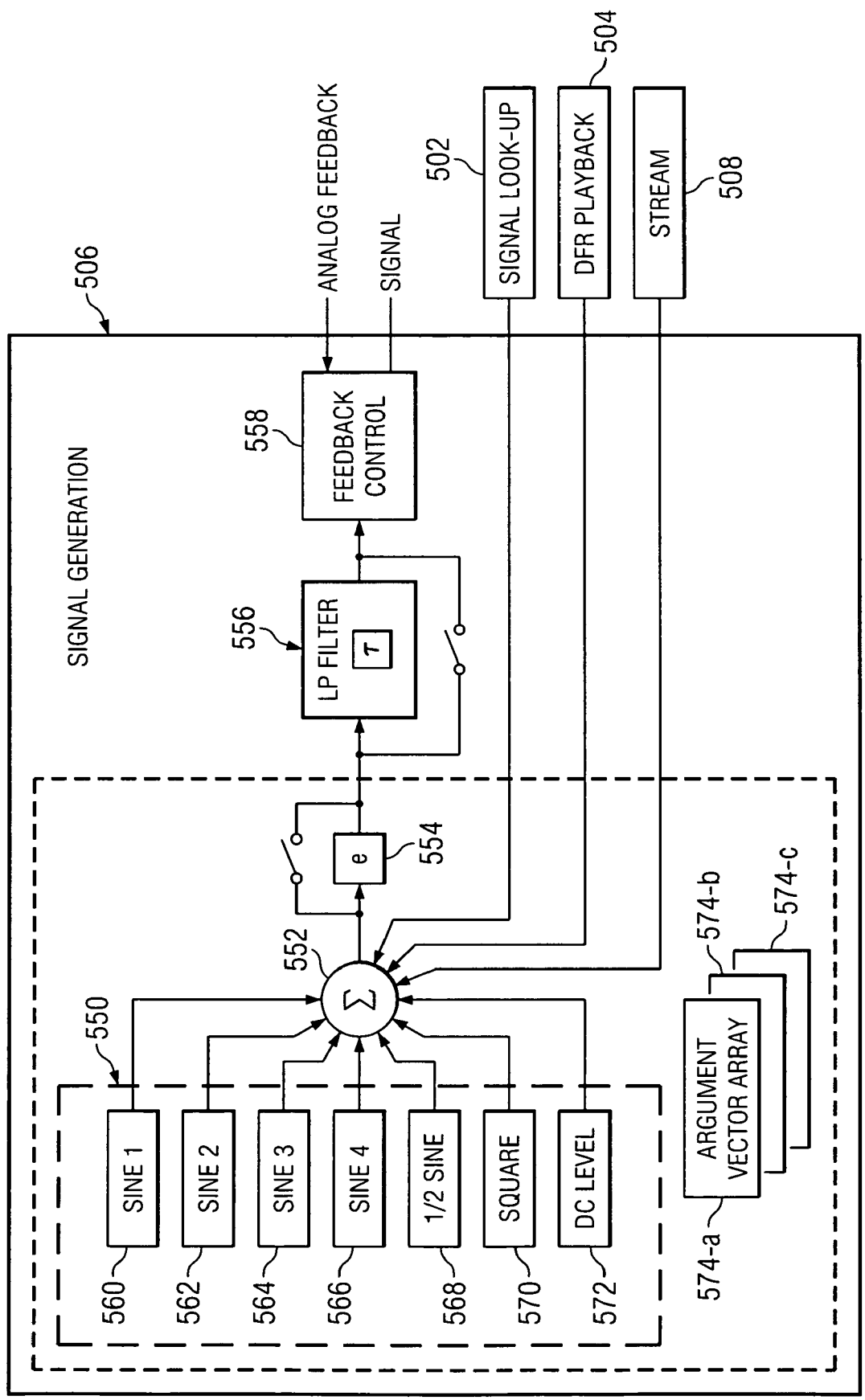
FIG. 12 is a block diagram of the signal generation functional component within the signal generator of the relay test device.

Turning now to FIG. 12, a block diagram depicts some of the software components included in the signal generation component 506. The signal generation component 506 generates an arbitrary periodic test signal from real-time calculations. The approach of generating a test signal from real-time calculations supports generating many more kinds of test signals than may be generated using other generation techniques. The ability to generate more kinds of test signals can be used to conduct more thorough and/or more realistic testing of relays.

The signal generation component 506 includes a plurality of waveform generators 550. In an embodiment, a plurality of outputs of the wave form generators 550 feed into a merge component 552 which combines the several signal components produced by the waveform generators 550. In another embodiment, the plurality of outputs of the wave form generators 550 and the outputs of the signal look-up component 502, the DFR playback component 504, and the streaming data playback component 508 are combined in the merge component 552. The merge component 552 may sum inputs, as for example adding the outputs of two or more wave form generators 550. The merge component 552 may mix inputs, as for example modulating a DFR signal output by the DFR playback component 504 onto a 60 Hz sinewave signal output by one of the wave form generators 550. The merge component 552 may sum inputs, mix inputs, and functionally combine inputs in other ways. An output of the merge component 552 feeds into an exponential damping component 554 which may exponentially dampen the output of the merge component 552. An output of the exponential damping component 554 feeds into a digital low pass filter 556 which may selectively attenuate the high frequency signal components of the output of the exponential damping component 554. In an embodiment, the output of the digital low pass filter 556 may feed into a feedback control component 558 which provides an analog feedback control loop. In an embodiment, the digital output of the low pass filter 556 is converted from a digital to an analog signal by the feedback control component 558. In an alternate embodiment, a digital-to-analog converter, not shown, between the low pass filter 556 and the feedback control component 558 converts the digital output of the low pass filter 556 to provide an analog signal to the feedback control component 558. The feedback control component 558 receives an analog feedback from the amplifier 452 and produces the input to the amplifier 452. The amplifier 452 produces the output signal for testing the relay under test 24.

Alternately, the analog feedback control loop is closed by analog control components within the amplifier 452 and the feedback control component 558 is not part of the signal generation component 506. In this embodiment, the output of the low pass filter 556 produces the input to the amplifier 452. The amplifier 452 produces the output signal for testing the relay under test 24.

In an embodiment, the plurality of waveform generators 550 includes a first sine waveform generator 560, a second sine waveform generator 562, a third sine waveform generator 564, a fourth sine waveform generator 566, a half-sine waveform generator 568, a square waveform generator 570, and a DC level waveform generator 572. The DC level waveform generator 572 may provide a DC offset or a voltage offset. Each waveform generator 550 is initialized with functional arguments stored in an argument vector. In another embodiment, other orthogonal or logic based functions known to the signal processing art may be employed to generate signal components. This includes but is not limited to those signals generated via simple tables, mathematical formulas, hybrid combinations thereof, to those created via very complex algebraic formulas, such as used in Wavelet Theory or Fractal Signal Representation and other signal mixing and reproduction functions. The functional arguments and method of implementation determine the waveforms generated by the waveform generators 550.

The group of argument vectors needed to initialize all of the waveform generators 550 are stored in an argument vector array 574. A plurality of argument vector arrays 574—a first argument vector array 574-a, a second argument vector array 574-b, and a third argument vector array 574-c—are stored for use by the signal generation component 506. A wide range of argument values may be specified, enabling the signal generation component 506 to generate a large number of different composed signals, providing useful flexibility for testing relays. In an embodiment, a 14.4 kHz interrupt clock frequency limits the maximum frequency of generation of a periodic waveform signal to less than 7.2 kHz, based on the Nyquist theorem, but in other embodiments a higher frequency interrupt clock may support generating higher frequency waveform signals.

In an embodiment, each signal generation component 506 is able to store 128 independent argument vector arrays 574, but in other embodiments either more or fewer independent argument vector arrays 574 may be stored. The control component 500 may select a different one of the 128 independent argument vector arrays 574 to be active during each calculation period, thereby changing the signal components produced by the waveform generators 550. By changing between several independent argument vector arrays 574 during a test, the signal generation component 506 is able to produce a complex digital waveform for testing.

The first sine waveform generator 560, the second sine waveform generator 562, the third sine waveform generator 564, the fourth sine waveform generator 566, the half-sine waveform generator 568, and the square waveform generator 570 are initialized with an amplitude argument, a frequency argument, and a phase argument from the argument vector 574 associated with each waveform generator 550. In an embodiment, the frequency arguments associated with the second sine waveform generator 562, the third sine waveform generator 564, the fourth sine waveform generator 566, the half-sine waveform generator 568, and the square waveform generator 570 may be constrained to be a harmonic frequency of the frequency argument of the first sine waveform generator 560. In another embodiment, however, the frequency arguments may not be constrained to be a harmonic frequency of the frequency argument of the first sine waveform generator 560. Each waveform generator 550 may be completely autonomous from other waveform generators 550 by utilizing separate mathematical vectors. Each waveform generator 550 may be completely autonomous from the common fundamental interrupt clock frequency, instead being based on vectors provided to the interrupt clock processor which may set a completely different interrupt clock speed.

The DC level waveform generator 572 is configured simply with an amplitude argument, as there is no frequency or phase associated with a constant level signal. When the VI CPU 450 receives a clock interrupt, a clock interrupt service routine executes in which each of the waveform generators 550 calculates the value of the signal component associated with the waveform generator 550 and outputs the digital value of the signal component to the merge component 552.

In an embodiment, the first sine waveform generator 560, the second sine waveform generator 562, the third sine waveform generator 564, the fourth sine waveform generator 566, and the half-sine waveform generator 568 may calculate discrete sinusoidal signals or segments of discrete sinusoidal signals based on a series expansion summation algorithm which employs a first approximation looked up in a data table. For example, a table of sine values for 0, 10, 20, 30, 40, 50, 60, 70, 80, and 90 degrees may be employed to look-up a first approximation of $\sin(\Theta)$. Selecting a good first approximation of $\sin(\Theta)$ will lead to the series expansion summation algorithm converging quickly on an accurate solution. In other embodiments, other methods for calculating discrete sinusoidal signals or segments of discrete sinusoidal signals well known to those skilled in the art may be employed.

The exponential damping component 554 calculates a damping coefficient $a^n$, which the exponential damping component 554 multiplies with the output of the merge component 552 to produce the output of the exponential damping component 554. In practice, a computer program may calculate the damping coefficient $a^n$ as $a(a^{n-1})$, where $(a^{n-1})$ is the previously calculated value of the damping coefficient. For example, the values of $(1/2)n$ can be calculated as:

$$(0.5)^0 = 1$$

$$(0.5)^1 = 0.5(1) = 0.5 = a^1 = a(a^0)$$

$$(0.5)^2 = 0.5(0.5) = 0.25 = a^2 = a(a^1)$$

$$(0.5)^3 = 0.5(0.25) = 0.125 = a^3 = a(a^2)$$

$$(0.5)^4 = 0.5(0.125) = 0.0625 = a^4 = a(a^3)$$

The value of a is a positive real number equal to or less than 1. If a is equal to 1, the damping coefficient $a^n$ will remain 1, effectively turning off the exponential damping component 554. In FIG. 12, the switch bypassing the exponential damping component 554 illustrates this concept of turning off or bypassing the exponential damping component 554. In an embodiment, the software implementing the exponential damping component 554 may respond to an argument value of 1 for a by simply outputting the digital value presented to the input of the exponential damping component 554. The value of a is stored in the argument vector array 574. In some embodiments, another method of calculating an exponential damping function known to those skilled in the art may be employed. The exponential damping component 554 may be useful for providing a relay test signal that models a short circuit transient.

The low pass filter component 556 is a digital filter which mathematically attenuates high frequency content in the digital output from the exponential damping component 554. The frequency cut-off of the low pass filter component 556, the frequency at which the low pass filter component 556 attenuates the power of a frequency component to half its original value (or 0.7 times the value of the voltage or current amplitude of the frequency component), is controlled by a tau parameter which is stored in the low pass filter component and is independent of the argument vector arrays 574. In an embodiment, the tau parameter represents a time constant of the low pass filter. A wide variety of digital filters are known to those skilled in the art, including finite impulse response type filters, auto regressive moving average filters, and digital filter designs obtained by transforming analog designs. All of these low pass filter designs are contemplated by the present disclosure. The low pass filter component 556 may provide useful smoothing of the digital signal when changing between independent argument vector arrays 574 as described above, or smoothing any sudden change of the fundamental signal itself. The output of the amplifier 452 may be selected to different boost ranges, and the tau parameter may be a different value during the range change transition. The low pass filter component 556 may be disabled or bypassed, a concept illustrated in FIG. 12 by a switch bypassing the low pass filter component 556.

In one embodiment, the signal components, the summation of the signal components, the exponential damping processing, the low pass filtering, and the feedback control calculations are calculated during each calculation period or clock interrupt service routine to produce the generated signal output.

Returning to FIG. 11, the DFR playback component 504 plays-back the DFR file 512 which may contain the digital recording of a fault experienced by a relay in the field. The DFR file 512 is loaded from an external source into the controller module 14, for example from a laptop computer, a workstation, or downloaded via the Internet. The controller module 14 sends the DFR file 512 with other control information to the VI generator 16. During the clock interrupt service routine, the DFR playback component 504 reads the appropriate value of the DFR signal out of the DFR file 512 and outputs that value as the number representing the digital signal at that moment in time. Multiple DFR files 512 may be loaded from an external source into the controller module 14 and thereafter forwarded with other control information to the VI generator 16. These multiple DFR files 512 may be concatenated or played back-to-back.

In some cases the sampling frequency of the DFR file 512 may not match the clock interrupt frequency presented to the VI CPU 450. For example, the clock interrupt frequency presented to the VI CPU 450 may be 14.4 kHz while the sampling frequency employed to record the DFR file 512 may be 12.335 kHz. Playing back the 12.335 kHz DFR file 512 at 14.4 kHz would result in frequency shifting the entire frequency spectrum of the DFR file 512 up by 17%, which is generally undesirable.

In an embodiment, the content of the DFR file 512 may be mathematically converted for play-back at 14.4 kHz. The DFR file 512 may be converted to a higher frequency digital signal which is a multiple of the sampling frequency of the DFR file 512 and the nominal clock interrupt frequency. In this case, new data points which occur between the original sampled data may be calculated by linearly interpolating between the original sampled data. Alternately, another mathematical interpolation technique known to those skilled in the art may be employed. The higher frequency digital signal may then be played back, selecting those data points that match the nominal clock interrupts and ignoring those data points that do not match the nominal clock interrupts. In an embodiment, on selection of the associated test procedure, as a test initialization activity, the DFR file 512 may be processed using this approach to produce an interpolated version of the DFR file 512, based on the nominal interrupt clock frequency, and when the test executes the interpolated version of the DFR file may be played back. This mathematical solution, however, may present an excessive processing load in some embodiments.

Synchronization of Sampling to Playback Frequency

An alternate solution to play-back of the DFR file 512 that has been recorded at an incompatible sampling frequency is to adjust the clock interrupt frequency presented to the VI CPU 450 to accord with the sampling frequency of the DFR file 512. As the VI CPU 450 may be composed of multiple processors, FPGAs, DSPs, CPLDs, and ASICS, only the clock interrupt sent to the device or devices involved in generating the stream of signal values needs to be frequency adjusted. When the clock interrupt frequency is adjusted in this way, the clock interrupt service routine executes at the sampling frequency, and the playback reproduces the originally recorded signal. To support this capability, a DFR test may be configured by identifying the DFR file 512 and the desired clock interrupt frequency for the DFR test employing the UI 20. In an embodiment, the clock interrupt frequency may be changed arbitrarily at any time.

Figure 13:
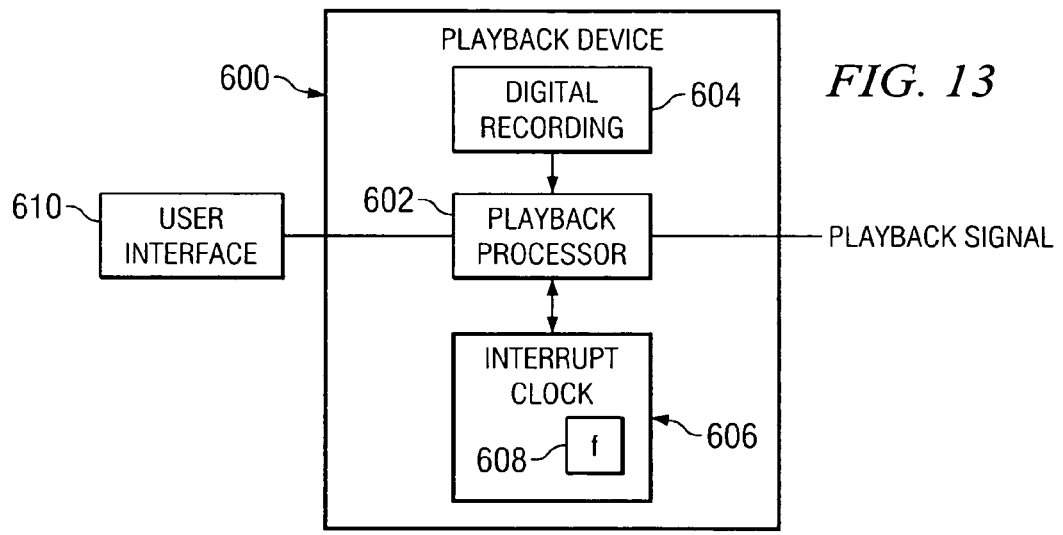
FIG. 13 is a block diagram of a digital recording playback system employing an adaptive clock interrupt.

Turning now to FIG. 13, a playback device 600 that employs an adjustable clock interrupt frequency is depicted. The playback device 600 includes a playback processor 602, a digital recording 604, and an interrupt clock 606 containing a clock interrupt frequency parameter 608. The interrupt clock 606 generates an interrupt clock signal at a frequency determined by the interrupt frequency parameter 608, for example at 12.335 kHz. The interrupt clock signal is received by the playback processor 602, causing the playback processor 602 to execute a clock interrupt service routine. In the clock interrupt service routine, a data sample in the digital recording 604 is read and played back to produce a playback signal that is output by the playback device 600.

The playback signal may be an analog output produced by processing the data sample and converting to an analog signal for output. The playback signal may be a digital output produced directly from the data sample or based on processing the data sample, for example after digitally filtering the stream of data samples to selectively enhance one or more ranges of frequency content and to selectively attenuate one or more alternate ranges of frequency content. The ability to adjust the interrupt clock 606 in this way to coordinate the sampling frequency with the playback frequency has utility for devices which playback digital recordings which may be recorded at arbitrary frequencies.

In an embodiment, the playback processor 602 determines the sampling frequency of the digital recording 604 by reading data stored with the digital recording 604 or by analyzing the content of the digital recording 604. In another embodiment, a UI 610 is in communication with the playback device 600, and the UI 610 provides the sampling frequency to the playback processor 602. The playback device 600 sends the clock interrupt frequency parameter 608, based on the sampling frequency of the digital recording 604, to the interrupt clock 606. The clock interrupt frequency parameter 608 may be an integer multiple of the sampling frequency of the digital recording 604, for example one times the sampling frequency, two times the sampling frequency, or 16 times the sampling frequency.

Figure 14:
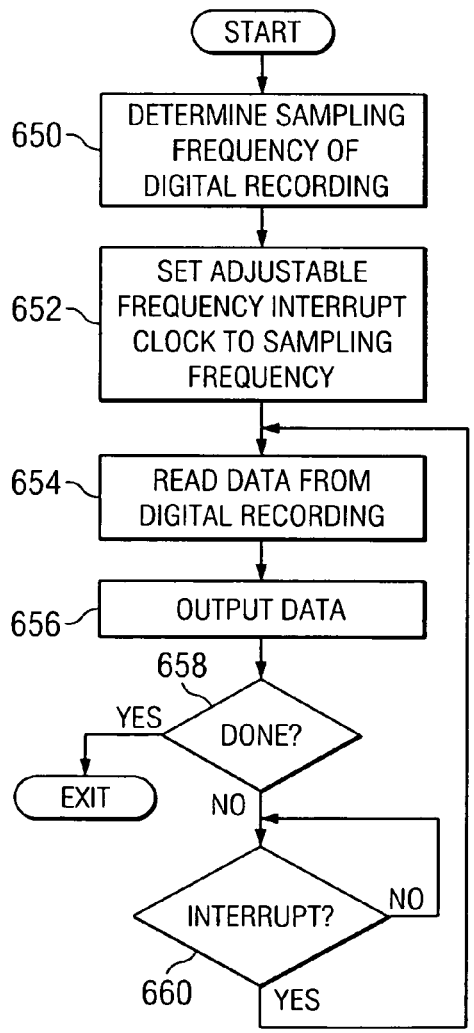
FIG. 14 is a flow chart illustrating a method for using a digital recording playback system employing an adaptive clock interrupt.

Turning now to FIG. 14, a flow chart depicts a method for adjusting an interrupt clock for playing back a digital recording 604. In block 650 the sampling frequency of the digital recording 604 is determined. The sampling frequency of the digital recording 604 may be embedded in the digital recording 604 itself or may be associated with the format or protocol of the digital recording 604. Alternately, the sampling frequency of the digital recording 604 may be supplemental information provided to a playback device 600, for example data provided to the relay test device 10. The method proceeds to block 652 where the sampling frequency is used to adjust the interrupt clock frequency of the playback device 600. The interrupt clock frequency of the playback device 600 may be adjusted to an integer multiple of the sampling frequency, for example the same frequency as the sampling frequency wherein the integer multiple is one.

The method proceeds to block 654 where the playback device 600 reads a data sample from the digital recording 604. The method proceeds to block 656 where the playback device 600 converts the data to a useful form, for example converting the data to an analog output suitable to drive an audio speaker or to drive the relay under test 24. The method proceeds to block 658 where if the digital recording 604 has not completed playback, the method proceeds on to block 660. In block 660 the method waits until the next clock interrupt is generated and then returns to block 654. The method loops through block 654, 656, 658, and 660 until the digital recording 604 has been completely played back. In block 658 when playback of the digital recording 604 has completed, the method exits.

This method may be employed by the relay test device 10 to playback DFRs which were recorded at a sampling rate different from a nominal interrupt clock frequency of the VI CPU 450. More generally, this method may be useful for playing back any digital recording 604 where the sampling frequency of the digital recording 604 is different from a nominal interrupt clock frequency of the playback device 600.

Returning to FIG. 11, the signal look-up component 502 is associated with a data table 510 which stores a periodic signal in memory. Rather than calculate the value of the periodic signal in each calculation period, each of the values of the periodic signal over a complete cycle of the period of the signal are pre-computed, stored in memory, and repeatedly played back in sequence. The data table 510 may be calculated by the VI CPU 150 as an initialization operation when commanded by the controller module 14, may be calculated by the controller module 14 and sent with other control information to the VI CPU 150, or may be calculated external to the relay test device 10 and loaded along with test definitions. The signal look-up component 502 may provide compatibility with legacy testing procedures. The signal look-up component 502 reads the appropriate value of the periodic signal and outputs that value as a binary number.

The streaming data playback component 508 plays-back a streaming data input, much as the DFR component 504 plays back a DFR file 512. The functionality provided by the streaming data playback component 508 is useful when, for example, a desirable playback recording is too long for storing and reading back from a file. The streaming data is received by one of the interfaces of the relay test device 10, such as at an Ethernet interface, and directed to the controller module 14. The controller module 14 may perform flow control on the streaming data to avoid overflowing buffers in the streaming data playback component 508. The controller module 14 sends the streaming data over the LVDS bus 18 to the VI generator 16. The streaming data flows to the VI CPU 450 and thence to the streaming data playback component 508. The streaming data playback component 508 may perform various processing of the streaming data including attenuating selected frequencies or frequency ranges, boosting selected frequencies or frequency ranges, phase shifting the streaming data, and other transformations known to those skilled in the art. Some of this processing may be performed by the embedded PC CPU 100 in the controller module 14 before the controller module 14 sends the streaming data over the LVDS bus 18 to the VI generator 16.

Hand-held Controller for Relay Test Device

Figure 15:
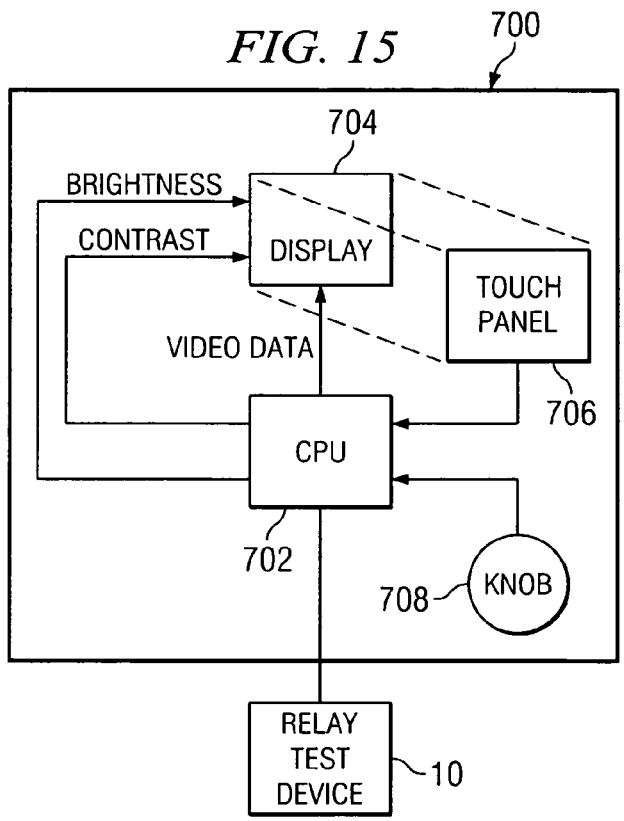
FIG. 15 is a block diagram of a touch view interface for use with the relay test device.

Turning now to FIG. 15, a block diagram of a touch view interface (TVI) 700 is depicted. As mentioned above, in one embodiment the TVI 700 fulfills the role of the UI 20. In an embodiment, the TVI 700 may be permanently attached to the enclosure 22. In another embodiment, the TVI 700 may be remotely connected via wireless means, such as radio frequency or infrared communications. In another embodiment, the TVI 700 may be tethered to the enclosure 22 by a removable cable which provides electronic signals or fiber optic light signals to the TVI 700.

The TVI 700 may be employed to select test procedures or test programs from a menu of available test procedures, to configure test procedure parameters, to display test outputs or test inputs dynamically during the execution of a test procedure, and to display test results. The TVI 700 may also be used to view and manage files stored on the relay test device 10, for example test log files. The dynamic display of test outputs or test inputs during the execution of the test procedure may be termed a real-time display of metered voltage, current, phase, and frequency. This real-time display feature may be employed by the test operator to verify a valid test environment and to verify the applied characteristics or test outputs while testing.

The TVI 700 includes a TVI CPU 702, a display component 704, a touch panel component 706, and a control knob 708. The TVI CPU 702 may comprise one or more DSPs, FPGAs, PLDs, CPLDs, ASICs, uPs, and uCs or a combination thereof. The TVI CPU 702 may be in communication with memory components including RAM, ROM, EPROM, EEPROM, and/or flash. The versioned programs 428 may be installed in the memory components or used to re-program the TVI CPU 702 using the software/firmware installation system described above. In an embodiment, the TVI CPU 702 is implemented as a single CPLD.

The TVI CPU 702 communicates with the relay test device 10 to receive display control signals and to return inputs from the touch panel 706 and from the control knob 708. In this embodiment, the intelligence needed to manage files and to navigate menus resides in the relay test device 10. In another embodiment, this intelligence may reside in the TVI CPU 702.

In an embodiment, the TVI CPU 702 communicates with the relay test device 10 using LVDS. In other embodiments, the TVI CPU 702 and relay test device 10 may communicate using optical, spread spectrum wireless, orthogonal frequency division multiplexing (OFDM) wireless, infrared, and high voltage level signals developed using voltage steppers or other voltage boosting mechanism, or a combination thereof. The control knob 708 combines a rotary control and a pushbutton control in one combined device. The rotary control may be employed to ramp test control values, such as ramping commanded voltage from 1 volt to 5 volts.

The touch panel component 706 physically overlays the display component 704, as indicated by the dashed lines in FIG. 15. The display component 704 is based on liquid crystal display (LCD) technology. The light emitted by the display component 704 passes through the touch panel component 706. The TVI CPU 702 sends a backlight brightness control signal and a LCD contrast control signal to the display component 704. The TVI CPU 702 sends a digital video signal to the display component 704 whereby the display component 704 is painted with an image or screen. The TVI CPU 702 stores the last known contrast and brightness values when the TVI CPU 702 is powered down. The TVI CPU 702 recalls the stored contrast and brightness values during power up and uses these values until receiving control signals from the relay test device 10. In an embodiment, the TVI CPU 702 maps a transistor transistor logic (TTL) video signal received from the relay test device 10 to generate the LCD contrast control signal. The TVI CPU 702 updates the display component 704, which also may be referred to as painting the display component 704, in realtime. In an embodiment, the display component 704 provides high-resolution graphics capabilities.

The touch panel component 706 is based on thin film transistor technology. The TVI CPU 702 periodically reads or polls the touch panel component 706 to receive inputs and sends the inputs of the touch panel component 706 to the relay test device 10. The TVI CPU 702 also periodically reads or polls the control knob 708 and sends the inputs of the control knob 708 to the relay test device 10. The control knob 708 is operable to provide an on/off indication activated by pressing in on the control knob 708 like a pushbutton switch and to provide a variable indication activated by rotating the control knob 708 clockwise or counterclockwise.

The TVI 700 is ruggedized for use in a harsh environment. The outer shell of the TVI 700 is a durable material. In an embodiment, the material of the outer shell of the TVI 700 is vacuum-formed ABS plastic. The internal devices are mounted in mechanical shock absorbing foam. The control knob 708 is the only moving part on the TVI 700. In an embodiment, the TVI 700 may include one or more maintenance interfaces to support calibration and/or testing the TVI 700. The maintenance interfaces may include RS-232, RS-422, Joint Test Action Group (JTAG), USB, GPIB, wireless, IEEE-1394, and Ethernet interfaces. In an embodiment, the TVI 700 communicates with the relay test device 10 through a cable and receives electrical power from the relay test device 10 through the cable.

Figure 16:
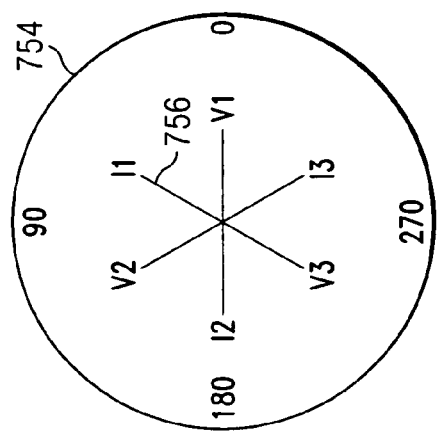
FIG. 16 depicts one embodiment of a graphical display of the touch view interface.

Turning now to FIG. 16, a manual test screen 750 which may be displayed by the TVI 700 is depicted. The manual test screen 750 illustrates several of the display and control capabilities of the TVI 700. A VI table 752 provides a real-time display of voltage and current parameters including magnitude, phase angle, and frequency which are output by the VI generators 16. A radial display 754 provides a real-time graphic display of voltage and current magnitude and phase wherein magnitude and phase angle are depicted by a phasor, for example a I1 phasor 756. The magnitude may be proportional to the length of the phasor, and the phase angle is indicated by the angle of the phasor. Several touch screen buttons 758 are operable to activate test functions or to select different screens. The TVI 700 may be operable to display in color to highlight active signals or signals out of limits. The currently active state indicator of the group of test state indicators 760, for example, may illuminate as a color appropriate to the testing application. For example, green may signify selected but not active. Red may indicate active and user attention is desirable to avoid danger. Red may also indicate a fault. The test state indicators 760 further promote user input of various fault states applied to relay under test 24. Other screens may display theoretical versus actual values of parameters. The manual test screen 750 is only exemplary, and other screens and views are contemplated for the TVI 700.

The TVI 700 may be employed to display a schematic drawing or a bit mapped digital image of the relay under test 24 and patch cables connecting the relay test device 10 to the relay under test 24 to facilitate initial test setup.

In one embodiment, a programming language and associated operation environment, such as Megger AVTS proprietary programming language and operation environment, may be used to define, set up, monitor, store, and analyze relay test procedures. The programming language and the associated operation environment may be operative on a laptop computer, a personal computer, the relay test device 10, or the TVI 700. An online ramp control capability may be employed to perform traditional steady-state tests by applying test quantities to the device under test and automatically ramping the current, voltage, phase angle, and/or frequency. Using either the online ramp or a vector controls capability, dynamic tests can be performed which may include setting a pre-fault condition and allowing the software to automatically test/search for the operating characteristic of the relay under test 24 by selecting one of several available methods. A plurality of test wizards, or test modules, may be selected from pull-down menus. Test wizards guide personnel through step-by-step procedures to create relay test procedures.

The online vector control provides direct control of the relay test system 10. Up to sixteen vector states, for example, may be created and played back through the relay test system 10. A timer control is available to enable starting the relay test system 10 timer at the execution of any one of the vector states. The timer stop is typically controlled by an action from one of the outputs of the relay under test 24 connected to the appropriate programmed input of the relay test system 10.

The online ramp control provides direct real-time control of the relay test system 10. This control is similar to the online vector control, but the online ramp control provides automatic ramping of selected outputs to do pick-up or drop-outs tests of amplitude, phase angle, and/or frequency. A timer control is available to enable starting one of the timers of the relay test system 10 at the execution of either of the ramp states. The timer stop is typically controlled by an action from one of the outputs of the relay under test 24 connected to the timer stop gate.

Test wizards are available for the most common types of relays including over-current, over/under voltage, frequency, differential, distance, synchronizing, and directional. The over-current wizard provides automatic pickup, instantaneous pickup, and timing. IEEE and IEC time curve algorithms are provided for automatic evaluation of test results. Digitized time curves for various electromechanical over-current relays are also available. A DC target and seal-in test is available to test North American relays. The over/under voltage wizard provides automatic pickup and timing. The frequency wizard provides automatic pickup and timing tests for over or under frequency relays. The differential wizard performs automatic winding pickup, differential characteristic (slope) test and harmonic restraint tests. The distance wizard performs automatic reach, max angle of torque, and characteristic tests on single phase, three phase, open delta, or three phase Y connected relays. The user may choose between fixed voltage and vary current or fixed current and vary voltage. In addition, the user may select basic distance characteristics using a pull-down menu. A test report will provide pass/fail information of the test results based on user input for each of the over-current wizard, the over/under voltage wizard, the frequency wizard, the differential wizard, and the distance wizard. It will be appreciated that the present disclosure includes comprehensive programming and software to define, set-up, initiate, monitor, and analyze relay tests.

In one embodiment, a scripting language is employed to provide functionality which does not require compilation. Scripts developed using the scripting language are embedded into a relay test module which is a procedural test methods file that the software uses to know how to interact with and to direct test system 10 to test the relay under test 24. The scripting language includes the ability to communicate with external devices using interfaces such as RS232, USB, GPIB, and other interfaces. The scripts may be called from within the relay test module, in the execution environment. In an embodiment, the scripting language is VBScript, but other scripting languages may be employed in other embodiments, such as Perl or a proprietary scripting language developed specifically for use with the relay test device 10.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown as directly coupled or communicating with each other may be coupled through some interface or device, such that the items may no longer be considered directly coupled to each but may still be indirectly coupled and in communication with one another. Other examples of changes, substitutions, and alterations are ascertainable by one skilled in the art and could be made without departing from the spirit and scope disclosed herein.

What is claimed is:

1. A test device for testing relays, comprising:
a chassis;
four generator components removably coupled to the chassis, each one of three of the generator components operable to communicate with at least one of three phases for testing relays, the fourth generator component operable for testing and redundancy in the event of failure of one of the other generator components, each of the four generator components comprising:
a signal generator,
a CPU to promote test signal generation by the signal generator, and
one or more amplifiers to amplify signals generated by the signal generator; and
a controller coupled to communicate with each of the four generator components,
wherein the controller is operable to redirect signal generation by one of the generator components in the event of failure by another of the generator components.

2. A test device for testing relays, comprising:
a chassis;
a plurality of generator components removably coupled to the chassis, each of the plurality of generator components comprising:
a signal generator,
a CPU to promote test signal generation by the signal generator, and
one or more amplifiers to amplify signals generated by the signal generator; a controller coupled to communicate with the plurality of generator components; a storage device in communication with the controller and operable to store information,
wherein the information storable on the storage device includes correction and offset factors employed to correct imperfections in the uncorrected output, thereby calibrating the output system to referencing standards.

3. A system for testing a relay, comprising:
a signal generator operable to generate at least one test signal;
an amplifier operable to receive the test signal from the signal generator and amplify the test signal, and the amplifier further operable to output the test signal to the relay to test the relay; and
a controller module programmable with a relay test procedure, the controller module in communication with the signal generator to promote the signal generator generating test signals based on the relay test procedure, the controller module further operable to monitor a state of the relay and to determine a results of the relay test, wherein the controller module is further operable to request and receive one or more settings of the relay and to command the relay to change the settings to a desirable value.

4. A system for testing a relay, comprising:
a signal generator operable to generate at least one test signal;
an amplifier operable to receive the test signal from the signal generator and amplify the test signal, and the amplifier further operable to output the test signal to the relay to test the relay;
a controller module programmable with a relay test procedure, the controller module in communication with the signal generator to promote the signal generator generating test signals based on the relay test procedure, the controller module further operable to monitor a state of the relay and to determine a results of the relay test; and
a storage device operable to store a digital fault recording, the controller module operable to communicate the stored digital fault recording to the signal generator to prompt the signal generator to play-back the digital fault recording to test the relay.

5. A system for testing a relay, comprising:
a signal generator operable to generate at least one test signal;
an amplifier operable to receive the test signal from the signal generator and amplify the test signal, and the amplifier further operable to output the test signal to the relay to test the relay; and
a controller module programmable with a relay test procedure, the controller module in communication with the signal generator to promote the signal generator generating test signals based on the relay test proce dure, the controller module further operable to monitor a state of the relay and to determine a results of the relay test, wherein the controller module is further operable to receive from an external source streaming data and to communicate the streaming data to the signal generator for the signal generator to playback the streaming data as the test signal.

6. The system of claim 5 wherein the controller module is further operable to negotiate flow control of the streaming data with the external source.

7. The system of claim 5 wherein the controller module is further operable to process the streaming data.

8. The system of claim 7 wherein the controller module is operable to provide additional manipulation of the streaming data.

9. The system of claim 7 wherein the controller module and a central processing unit coupled to communicate with the signal generator are operable to provide additional manipulation of the streaming data.

10. The system of claim 7 wherein a central processing unit coupled to communicate with the signal generator is operable to modify an element of the streaming data.

* * * * *

UNITED STATES PATENT AND TRADEMARK OFFICE
CERTIFICATE OF CORRECTION

PATENT NO. : 7,005,856 B2
DATED : February 28, 2006
INVENTOR(S) : Bela Deak et al.

It is certified that error appears in the above-identified patent and that said Letters Patent is hereby corrected as shown below:

Column 5,
Line 66, delete "." after "further".

Column 8,
Line 7, replace "add" with -- and --.

Signed and Sealed this

Sixth Day of June, 2006

JON W. DUDAS
*Director of the United States Patent and Trademark Office*